United States Patent
David et al.

(10) Patent No.: US 8,913,384 B2
(45) Date of Patent: Dec. 16, 2014

(54) THERMAL TRANSFER STRUCTURES COUPLING ELECTRONICS CARD(S) TO COOLANT-COOLED STRUCTURE(S)

(75) Inventors: Milnes P. David, Fishkill, NY (US); David P. Graybill, Staatsburg, NY (US); Madhusudan K. Iyengar, Foster City, CA (US); Vinod Kamath, Raleigh, NC (US); Bejoy J. Kochuparambil, Apex, NC (US); Pritish R. Parida, Fishkill, NY (US); Roger R. Schmidt, Poughkeepsie, NY (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 13/527,947

(22) Filed: Jun. 20, 2012

(65) Prior Publication Data

US 2013/0343005 A1   Dec. 26, 2013

(51) Int. Cl.
*H05K 7/20* (2006.01)
*H05K 13/00* (2006.01)

(52) U.S. Cl.
USPC ............. 361/679.53; 361/700; 361/679.58; 361/688; 361/721; 361/704

(58) Field of Classification Search
USPC .......... 361/716, 721, 679.31, 679.32, 679.33, 361/679.53, 679.54, 679.58, 688–704, 715, 361/718, 719, 711, 709, 679.55, 722, 724, 361/725, 726–737, 740, 748, 758, 679.38, 361/679.46–679.52; 165/104.33, 104.21, 165/80.4, 67, 80.2, 104.149, 80.3, 104.26, 165/104.31, 138, 166, 185, 300; 29/890.035; 257/E23.088, E23.098, 257/713, 748, 773, 774; 362/294, 234, 253, 362/373, 96; 174/548; 438/122
See application file for complete search history.

(56) References Cited

U.S. PATENT DOCUMENTS 5,168,921 A   12/1992   Meyer
5,414,591 A   5/1995   Kimura et al.
(Continued)

FOREIGN PATENT DOCUMENTS

CN   201222836 Y   4/2009
DE   19925983 A1 * 12/2000
(Continued)

OTHER PUBLICATIONS

IBM Technical Disclosure, "Highly-Efficient Copper Rail Design for Optimized Cooling of DRAM Modules", IPCOM000184053D (Jun. 9, 2009).
(Continued)

*Primary Examiner* — Robert J Hoffberg
*Assistant Examiner* — Michael Matey
(74) *Attorney, Agent, or Firm* — Margaret McNamara, Esq.; Kevin P. Radigan, Esq.; Heslin Rothenberg Farley & Mesiti P.C.

(57) ABSTRACT

Cooling apparatuses and coolant-cooled electronic systems are provided which include thermal transfer structures configured to engage with a spring force one or more electronics cards with docking of the electronics card(s) within a respective socket(s) of the electronic system. A thermal transfer structure of the cooling apparatus includes a thermal spreader having a first thermal conduction surface, and a thermally conductive spring assembly coupled to the conduction surface of the thermal spreader and positioned and configured to reside between and physically couple a first surface of an electronics card to the first surface of the thermal spreader with docking of the electronics card within a socket of the electronic system. The thermal transfer structure is, in one embodiment, metallurgically bonded to a coolant-cooled structure and facilitates transfer of heat from the electronics card to coolant flowing through the coolant-cooled structure.

17 Claims, 21 Drawing Sheets

(56) References Cited

U.S. PATENT DOCUMENTS

| | | | |
|---|---|---|---|
| 5,794,454 | A | 8/1998 | Harris et al. |
| 6,263,959 | B1 | 7/2001 | Ikeda et al. |
| 6,411,512 | B1 | 6/2002 | Mankaruse et al. |
| 6,434,000 | B1 | 8/2002 | Pandolfi et al. |
| 6,480,014 | B1 | 11/2002 | Li et al. |
| 6,548,894 | B2 | 4/2003 | Chu et al. |
| 6,557,354 | B1 | 5/2003 | Chu et al. |
| 6,775,137 | B2 | 8/2004 | Chu et al. |
| 6,934,118 | B2 | 8/2005 | Hidaka et al. |
| 7,002,799 | B2 | 2/2006 | Malone et al. |
| 7,151,668 | B1 | 12/2006 | Stathakis |
| 7,221,569 | B2 | 5/2007 | Tsai |
| 7,233,501 | B1 | 6/2007 | Ingalz |
| 7,273,090 | B2 | 9/2007 | Crocker et al. |
| 7,286,355 | B2 | 10/2007 | Cheon |
| 7,361,985 | B2 * | 4/2008 | Yuan et al. ............ 257/713 |
| 7,365,985 | B1 | 4/2008 | Ni |
| 7,388,749 | B1 | 6/2008 | Feroli et al. |
| 7,395,851 | B2 | 7/2008 | Lee et al. |
| 7,436,663 | B2 | 10/2008 | Matsushima et al. |
| 7,440,278 | B2 | 10/2008 | Cheng |
| 7,443,672 | B2 | 10/2008 | Peng et al. |
| 7,573,714 | B2 | 8/2009 | Ali |
| 7,595,550 | B2 | 9/2009 | Cady et al. |
| 7,626,820 | B1 | 12/2009 | Konshak et al. |
| 7,684,196 | B2 | 3/2010 | Eckberg et al. |
| 7,703,291 | B2 | 4/2010 | Bushnik et al. |
| 7,791,881 | B2 | 9/2010 | Chou et al. |
| 7,796,393 | B2 | 9/2010 | Legen et al. |
| 7,796,399 | B2 | 9/2010 | Clayton et al. |
| 7,817,412 | B2 | 10/2010 | Sullivan |
| 7,969,736 | B1 | 6/2011 | Iyengar et al. |
| 7,986,528 | B2 | 7/2011 | Aoki |
| 8,027,162 | B2 | 9/2011 | Campbell et al. |
| 8,081,473 | B2 | 12/2011 | Cipolla et al. |
| 8,493,738 | B2 | 7/2013 | Chainer et al. |
| 8,599,557 | B2 * | 12/2013 | Peterson et al. ............ 361/699 |
| 8,649,177 | B2 | 2/2014 | Chainer et al. |
| 2001/0000880 | A1 | 5/2001 | Chu et al. |
| 2004/0250989 | A1 | 12/2004 | Im et al. |
| 2005/0068728 | A1 | 3/2005 | Chu et al. |
| 2005/0180113 | A1* | 8/2005 | Shirakami et al. ............ 361/704 |
| 2006/0146497 | A1 | 7/2006 | Gauche et al. |
| 2006/0221578 | A1 | 10/2006 | Foster, Sr. et al. |
| 2006/0250772 | A1 | 11/2006 | Salmonson et al. |
| 2007/0034356 | A1 | 2/2007 | Kenny et al. |
| 2007/0146990 | A1* | 6/2007 | Hsieh ............ 361/690 |
| 2007/0227709 | A1 | 10/2007 | Upadhya et al. |
| 2007/0263356 | A1 | 11/2007 | Weber et al. |
| 2007/0263359 | A1* | 11/2007 | Lai et al. ............ 361/715 |
| 2008/0101035 | A1 | 5/2008 | Chen |
| 2008/0112075 | A1 | 5/2008 | Farquhar et al. |
| 2008/0123300 | A1* | 5/2008 | Tian et al. ............ 361/721 |
| 2008/0155990 | A1 | 7/2008 | Gupta et al. |
| 2008/0239564 | A1 | 10/2008 | Farquhar et al. |
| 2008/0259566 | A1 | 10/2008 | Fried |
| 2008/0259567 | A1 | 10/2008 | Campbell et al. |
| 2008/0310105 | A1 | 12/2008 | Cheng |
| 2009/0002951 | A1 | 1/2009 | Legen et al. |
| 2009/0080151 | A1 | 3/2009 | Kalms et al. |
| 2009/0120607 | A1 | 5/2009 | Cheon et al. |
| 2009/0190304 | A1 | 7/2009 | Meyer et al. |
| 2009/0219687 | A1 | 9/2009 | Lin |
| 2009/0277616 | A1* | 11/2009 | Cipolla et al. ............ 165/104.33 |
| 2009/0284924 | A1 | 11/2009 | Konshak et al. |
| 2010/0025010 | A1 | 2/2010 | Cipolla et al. |
| 2010/0027220 | A1 | 2/2010 | Hughes et al. |
| 2010/0067193 | A1 | 3/2010 | Arimilli et al. |
| 2010/0085712 | A1 | 4/2010 | Hrehor et al. |
| 2010/0142147 | A1 | 6/2010 | Chang et al. |
| 2010/0175852 | A1 | 7/2010 | Peterson |
| 2010/0252234 | A1* | 10/2010 | Cambell et al. ............ 165/80.2 |
| 2010/0313590 | A1 | 12/2010 | Campbell et al. |
| 2011/0069454 | A1* | 3/2011 | Campbell et al. ............ 361/700 |
| 2011/0286175 | A1 | 11/2011 | Iyengar et al. |
| 2012/0026670 | A1 | 2/2012 | Rau et al. |
| 2012/0279047 | A1* | 11/2012 | Chainer et al. ............ 29/592.1 |
| 2012/0279233 | A1* | 11/2012 | Chainer et al. ............ 62/3.6 |
| 2012/0279686 | A1* | 11/2012 | Chainer et al. ............ 165/104.21 |
| 2012/0281358 | A1* | 11/2012 | Chainer et al. ............ 361/700 |
| 2013/0135812 | A1* | 5/2013 | Barina et al. ............ 361/679.32 |
| 2013/0194745 | A1* | 8/2013 | Meijer et al. ............ 361/679.47 |
| 2013/0342987 | A1* | 12/2013 | Yang et al. ............ 361/679.32 |

FOREIGN PATENT DOCUMENTS

| | | |
|---|---|---|
| JP | 01077199 A | 3/1989 |
| JP | 2010040886 A | 2/2010 |
| TW | 323643 U | 12/2007 |
| TW | 200937175 A | 9/2009 |
| WO | WO 2011053310 A1 | 5/2011 |
| WO | WO 2011110390 A1 | 9/2011 |

OTHER PUBLICATIONS

Torok, J.G. et al., "Packaging Design of the IBM System z10 Enterprise Class Platform Central Electronic Complex", IBM Journal of Research & Development, vol. 53, No. 1, Paper 9 (2009).

Office Action for U.S. Appl. No. 12/566,081 (U.S. Letters Patent No. 8,027,162 B2), dated Jan. 14, 2011.

Notice of Allowance for U.S. Appl. No. 12/566,081 (U.S. Letters Patent No. 8,027,162 B2), dated May 20, 2011.

Chainer et al., Office Action for U.S. Appl. No. 13/102,195, filed May 6, 2011 (U.S. Patent Publication No. 2012/0279233 A1), dated Jul. 17, 2013 (38 pages).

Chainer et al., Final Office Action for U.S. Appl. No. 13/102,195, filed May 6, 2011 (U.S. Patent Publication No. 2012/0279233 A1), dated Feb. 4, 2014 (16 pages).

Chainer et al., Restriction Requirement for U.S. Appl. No. 13/102,200, filed May 6, 2011 (U.S. Patent Publication No. 2012/0279686 A1), dated Sep. 24, 2013 (6 pages).

Chainer et al., Office Action for U.S. Appl. No. 13/102,200, filed May 6, 2011 (U.S. Patent Publication No. 2012/0279686 A1), dated Nov. 25, 2013 (48 pages).

Chainer et al., Office Action for U.S. Appl. No. 13/102,200, filed May 6, 2011 (U.S. Patent Publication No. 2012/0279686 A1), dated Apr. 4, 2014 (34 pages).

Chainer et al., Office Action for U.S. Appl. No. 13/102,211, filed May 6, 2011 (U.S. Patent No. 8,493,738 B2), dated Oct. 4, 2012 (32 pages).

Chainer et al., Notice of Allowance for U.S. Appl. No. 13/102,211, filed May 6, 2011 (U.S. Patent No. 8,493,738 B2), dated Mar. 25, 2013 (17 pages).

Chainer et al., Notice of Allowance for U.S. Appl. No. 13/451,714, filed Apr. 20, 2012 (U.S. Patent No. 8,649,117 B2), dated Jun. 14, 2013 (40 pages).

Chainer et al., Notice of Allowance for U.S. Appl. No. 13/451,714, filed Apr. 20, 2012 (U.S. Patent No. 8,649,117 B2), dated Aug. 27, 2013 (19 pages).

* cited by examiner

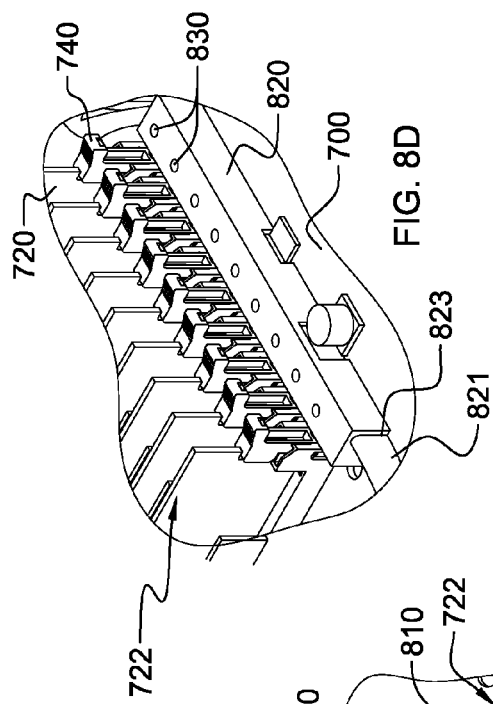
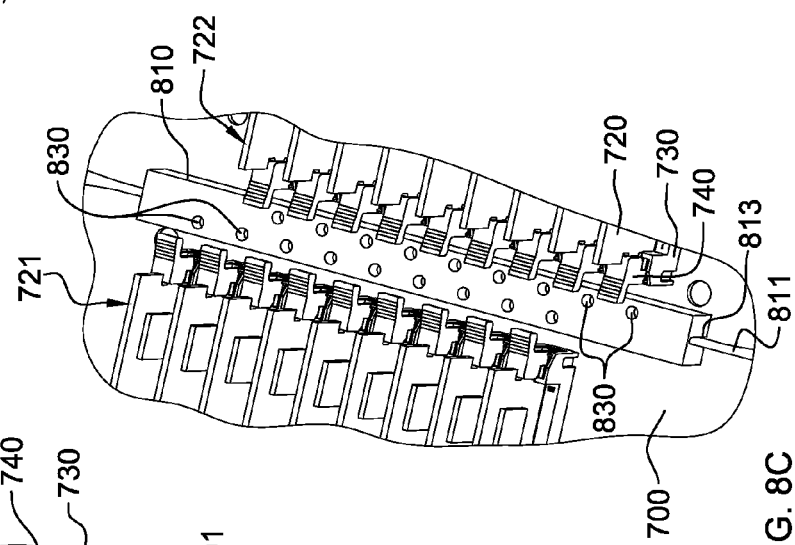
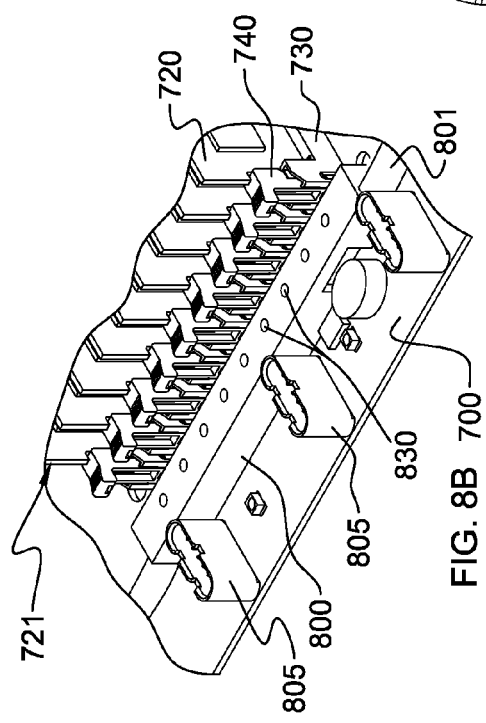

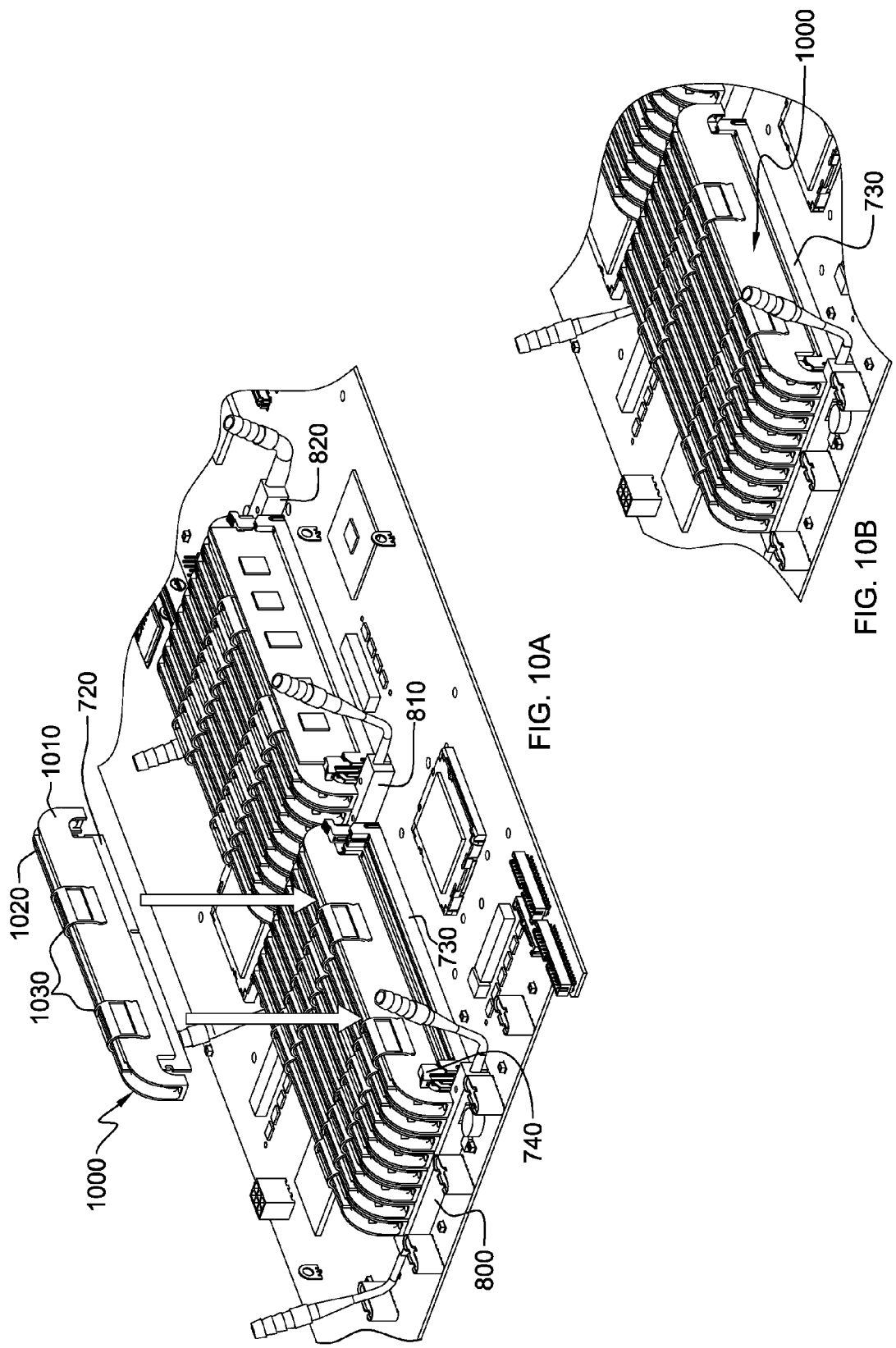

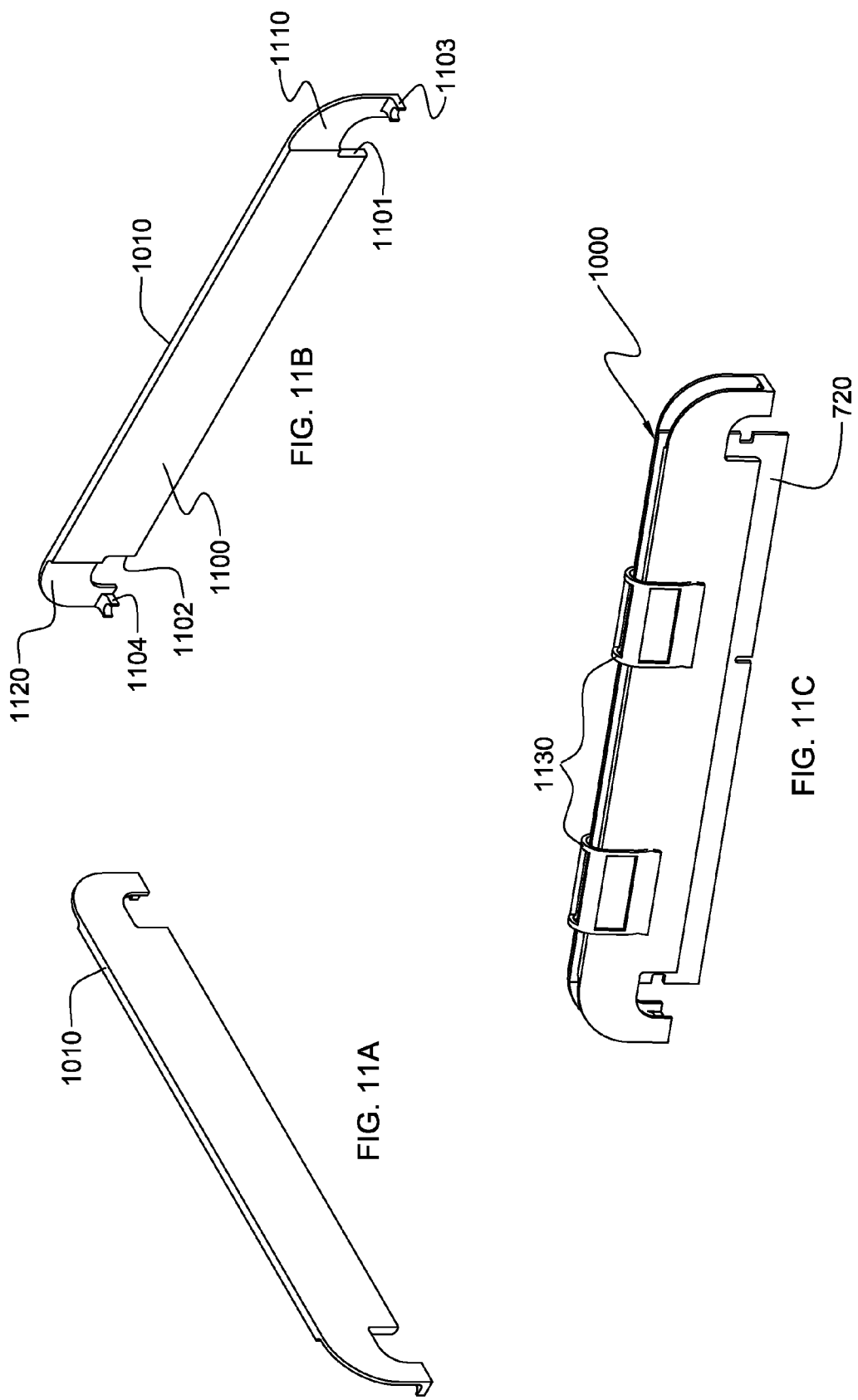

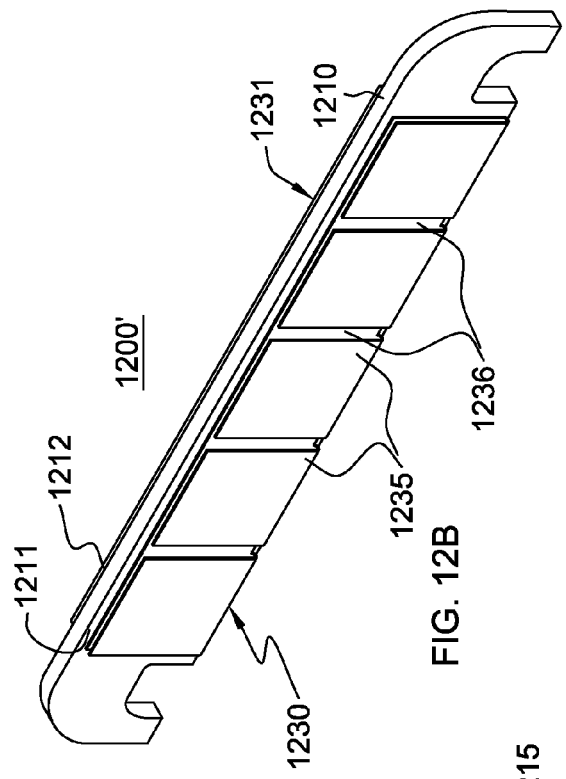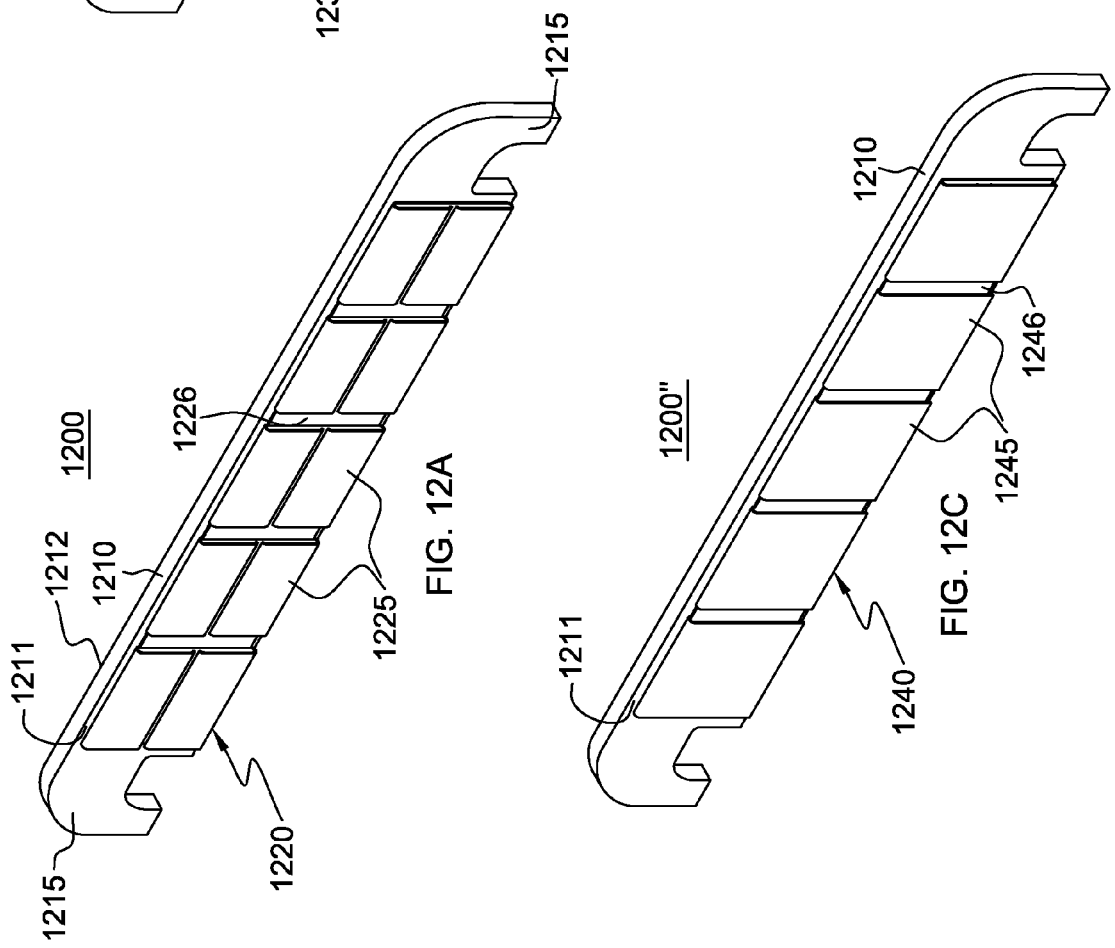

THERMAL TRANSFER STRUCTURES COUPLING ELECTRONICS CARD(S) TO COOLANT-COOLED STRUCTURE(S)

STATEMENT REGARDING FEDERALLY SPONSORED RESEARCH

This invention was made with Government support under Contract No. DE-EE0002894, awarded by the Department of Energy. Accordingly, the U.S. Government has certain rights in the invention.

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density.

BRIEF SUMMARY

In one aspect, the shortcomings of the prior art are overcome and additional advantages are provided through the provision of a cooling apparatus which includes a thermal transfer structure. The thermal transfer structure is configured to engage at least one electronics card with docking of the at least one electronics card within one or more respective sockets of an electronic system. The thermal transfer structure includes a thermal spreader, comprising a first thermal conduction surface, and a thermally conductive spring assembly secured to the thermal spreader and positioned and configured to reside between and physically couple a first surface of an electronics card, of the at least one electronics card, and the first thermal conduction surface of the thermal spreader with docking of the electronics card within a socket of the one or more sockets of the electronic system, and thereby facilitate conduction of heat from the electronics card to the thermal spreader.

In another aspect, a cooled electronic system is provided which includes an electronic assembly and a cooling apparatus. The electronic assembly includes an electronics card and a socket for receiving the electronics card. The electronics card comprises a first surface and a second surface, with the first surface and the second surface being opposite surfaces of the electronics card. The cooling apparatus includes a thermal transfer structure configured to engage the electronics card with docking of the electronics card within the socket. The thermal transfer structure includes a thermal spreader, comprising a first thermal conduction surface, and a thermally conductive spring assembly secured to the thermal spreader. The thermally conductive spring assembly is positioned and configured to reside between and physically couple the first surface of the electronics card to the first thermal conduction surface of the thermal spreader with docking of the electronics card within the socket, and thereby facilitate conduction of heat from the electronics card to the thermal spreader.

In a further aspect, a method of fabricating a cooled electronic system is provided which includes providing an electronic assembly comprising an electronics card and a socket configured to facilitate docking or undocking of the electronics card therein. The electronics card includes a first surface and a second surface on opposite sides of the electronics card, and the method further includes: providing a coolant-cooled structure at one end of the socket, the coolant-cooled structure comprising a thermally conductive structure with at least one coolant-carrying channel extending therein; and providing a first thermal transfer structure and a second thermal transfer structure configured to engage the first surface and the second surface of the electronics card, respectively, with docking of the electronics card within the socket, the first thermal transfer structure and the second thermal transfer structure being secured to the coolant-cooled structure and facilitating transfer of heat from the electronics card to the coolant-cooled structure, the first thermal transfer structure comprising a first thermally conductive spring assembly coupled to a first thermal conduction surface of a first thermal spreader of the first thermal transfer structure, and the second thermal transfer structure comprising a second thermally conductive spring assembly coupled to a second thermal conduction surface of a second thermal spreader of the second thermal transfer structure, wherein the first and second thermally conductive spring assemblies are positioned and configured to reside between and physically engage the first and second surfaces, respectively, of the electronics card with docking of the electronics card within the socket, and thereby facilitate conduction of heat from the electronics card through the first thermal transfer structure and the second thermal transfer structure to coolant within the coolant-cooled structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8B is a partial depiction of the partially assembled cooled electronic system of FIG. 8A, and illustrating in greater detail, one embodiment of the first liquid-cooled cold rail disposed at one end of the parallel-disposed sockets that form part of the first array of electronics cards, in accordance with one or more aspects of the present invention;

FIG. 8C is a partial depiction of the second liquid-cooled cold rail disposed at the other end of the sockets comprising part of the first array of electronics cards, and shown disposed between the first and second arrays of electronics cards illustrated in FIG. 8A, in accordance with one or more aspects of the present invention;

FIG. 8D depicts one embodiment of the third liquid-cooled cold rail disposed at the other end of the sockets that form part of the second array of electronics cards illustrated in FIG. 8A, in accordance with one or more aspects of the present invention;

FIG. 10A depicts the cooled electronic system of FIGS. 7-9D, with a thermal spreader shown clipped to an electronics card being inserted into a respective socket of the first array of electronics cards, in accordance with one or more aspects of the present invention;

FIG. 10B depicts the cooled electronic system of FIG. 10A, with the illustrated electronics card and associated thermal spreader shown in latched position within the first array of electronics cards, in accordance with one or more aspects of the present invention;

FIG. 11A depicts one embodiment of a thermal transfer plate of a heat spreader, similar to the heat spreader illustrated in FIGS. 9A-9D, in accordance with one or more aspects of the present invention;

FIG. 11B depicts the thermal transfer plate of FIG. 11A, and illustrates an opposite side of the plate, the opposite side comprising a thermal conduction surface to be physically coupled to a first surface on one side of a respective electronics card, in accordance with one or more aspects of the present invention;

FIG. 11C depicts one embodiment of an assembled subassembly comprising an electronics card, a thermal spreader, and spring clips shown forcing the thermal transfer plates of the thermal spreader together and into physical contact with surfaces on opposite sides of the electronics card, in accordance with one or more aspects of the present invention;

FIG. 12A depicts one embodiment of another thermal transfer structure of a cooling apparatus, in accordance with one or more aspects of the present invention;

FIG. 12B depicts an alternate embodiment of the thermal transfer structure of FIG. 12A, in accordance with one or more aspects of the present invention;

FIG. 12C depicts another alternate embodiment of the thermal transfer structures of FIGS. 12A & 12B, in accordance with one or more aspects of the present invention;

DETAILED DESCRIPTION

Figure 1:
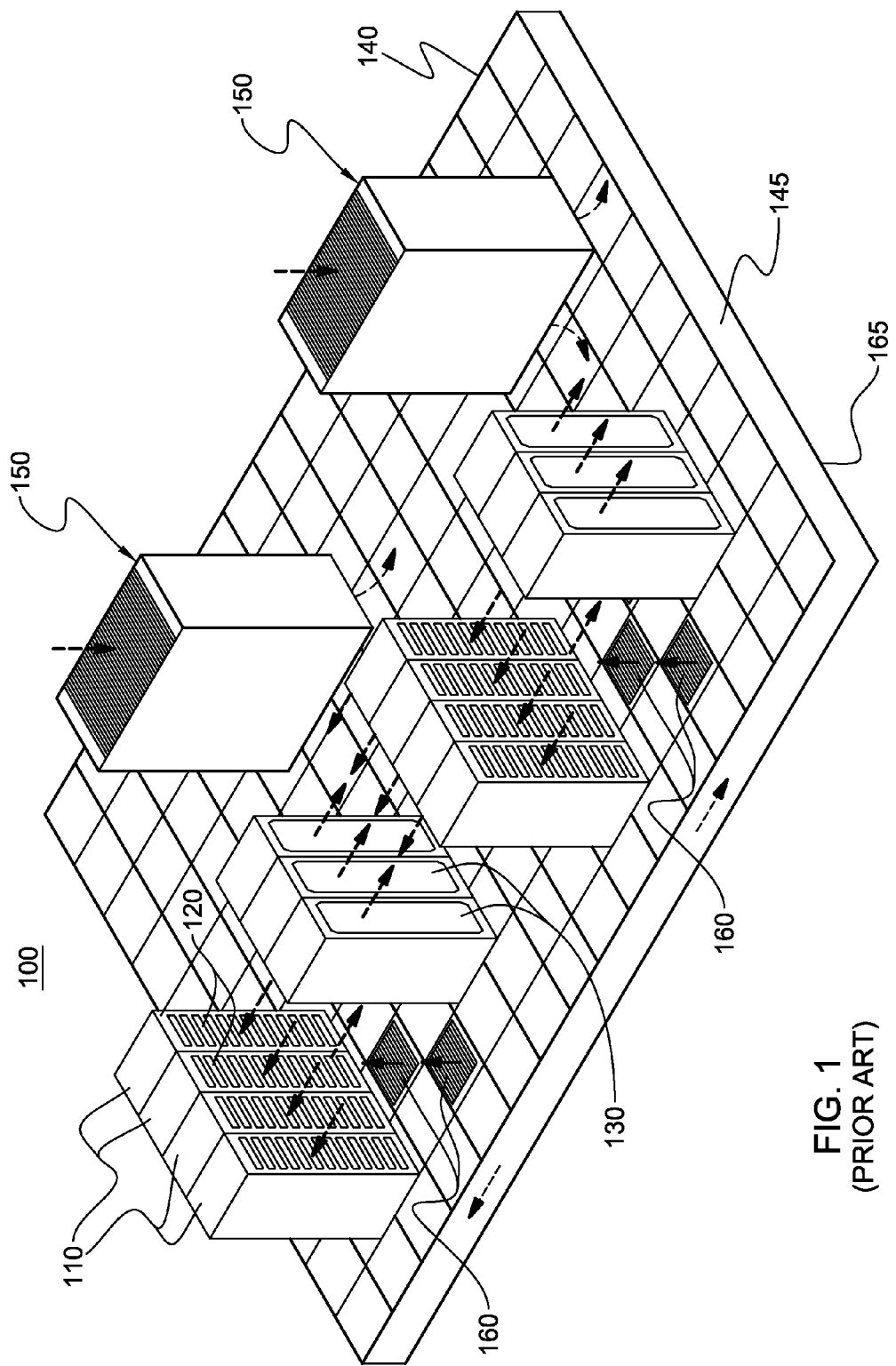
FIG. 1 depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system or electronic system, and may be, for example, a stand-alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or sub-systems) of an electronics rack to be cooled.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", "coolant-cooled cold plate" and "coolant-cooled cold rail" refer to structures having one or more channels (or passageways) formed therein or passing therethrough, which facilitate the flow of coolant (such as liquid coolant) through the structure. A coolant-cooled structure may be, for example, a coolant-cooled cold plate, a coolant-cooled cold rail, or a coolant manifold. In one example, tubing is provided extending through the coolant-cooled structure. An "air-to-coolant heat exchanger" or "air-to-coolant heat exchange assembly" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-coolant heat exchanger can vary without departing from the scope of the invention disclosed. Still further, "data center" refers to a computer installation containing one or more electronics racks to be cooled. As a specific example, a data center may comprise one or more rows of rack-mounted computer units, such as server units.

One example of coolant used within the cooling apparatuses and cooled electronic systems disclosed herein is water. However, the concepts presented are readily adapted to use with other types of coolant. For example, the coolant may comprise a brine, a glycol mixture, a fluorocarbon liquid, or other coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the rack unit. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air may comprise, in part, exhausted air from the "hot" aisles of the computer installation defined, for example, by opposing air outlet sides 130 of the electronics racks 110.

Figure 2:
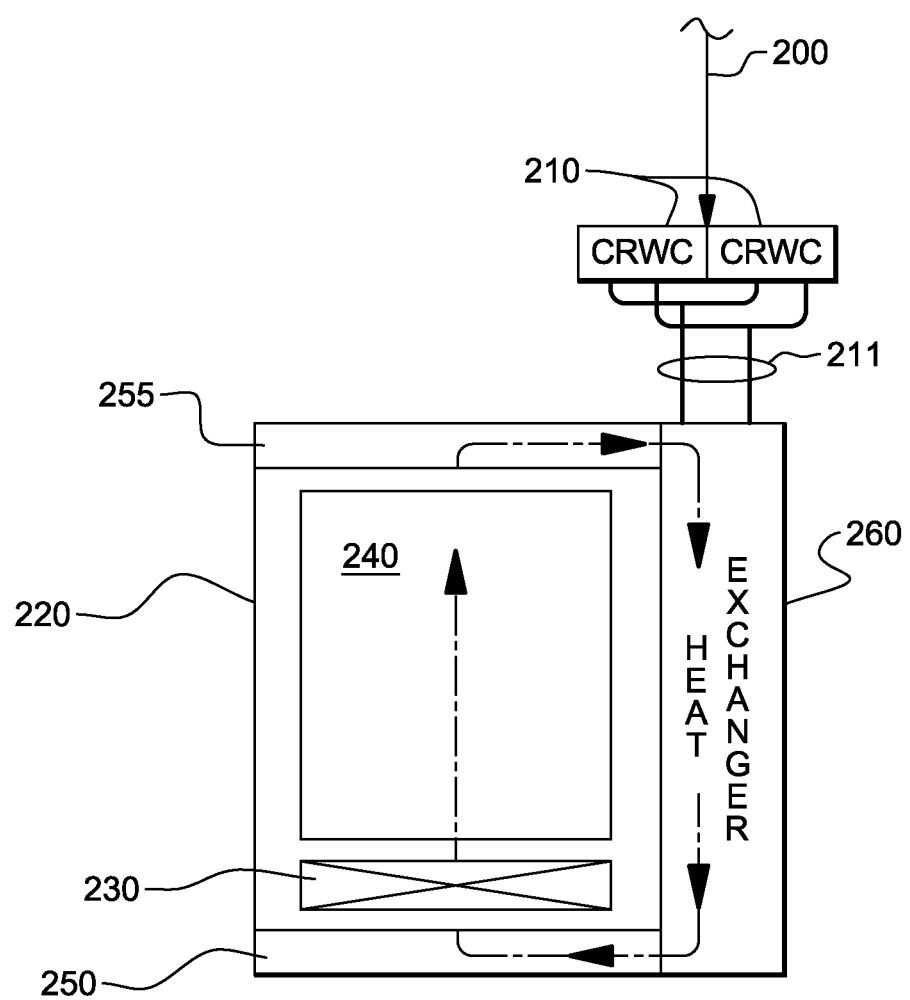
FIG. 2 is a cross-sectional plan view of one embodiment of an electronics rack with an attached air-to-liquid heat exchanger enhancing cooling of air passing through the electronics rack.
Figure 3:
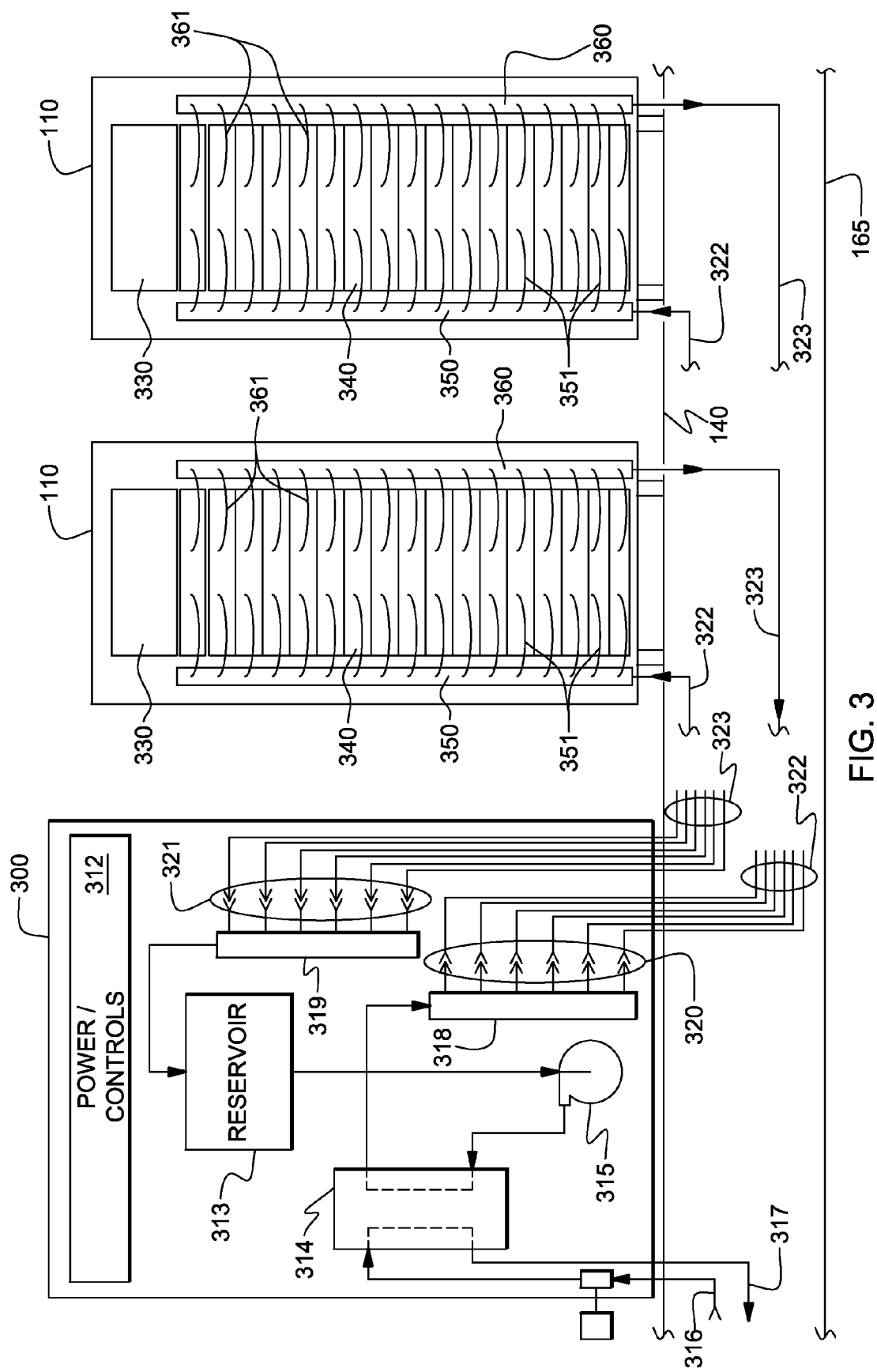
FIG. 3 depicts one embodiment of a data center with a coolant distribution unit facilitating liquid-cooling of one or more liquid-cooled electronics racks of the data center, in accordance with an aspect of the present invention.
Figure 4:
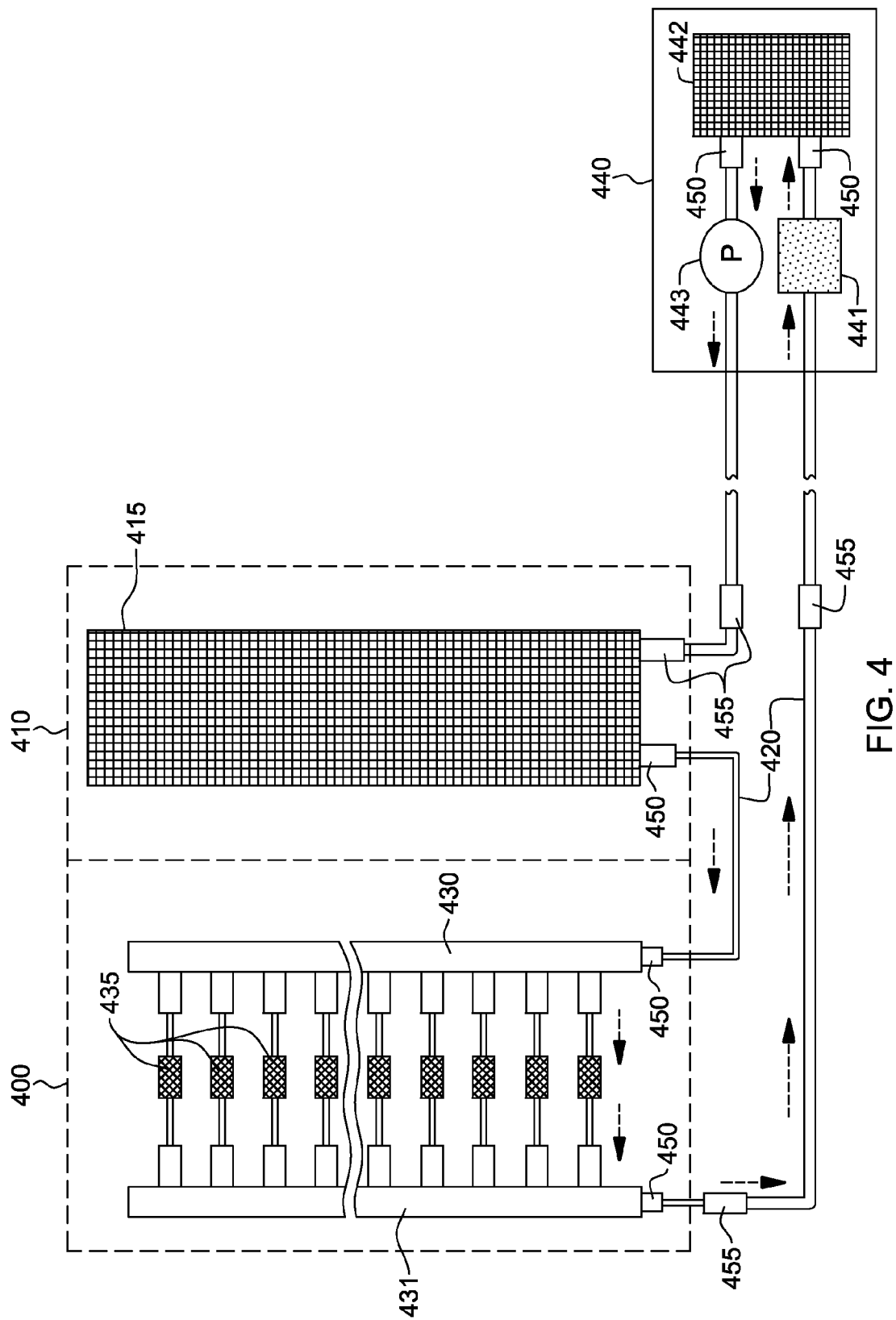
FIG. 4 depicts an alternate embodiment of a cooling apparatus and liquid-cooled electronics rack, in accordance with one or more aspects of the present invention.

Due to ever-increasing air flow requirements through electronics racks, and the limits of air distribution within a typical data center installation, liquid coolant-based cooling is being combined with conventional air-cooling. FIGS. 2-4 illustrate various embodiments of a data center implementation employing such a coolant-based cooling system.

FIG. 2 depicts one rack-level coolant-cooling solution which utilizes (by way of example) chilled facility water to remove heat from the computer installation room, thereby transferring the cooling burden from the air-conditioning unit(s) to the building's chilled water coolers. The embodiment depicted in FIG. 2 is described in detail in commonly assigned, U.S. Letters Pat. No. 6,775,137. Briefly summarized, facility-chilled water 200 circulates through one or more liquid-to-liquid heat exchangers 210, coupled via a system coolant loop 211, to individual electronics racks 220 within the computer room. Rack unit 220 includes one or more air-moving devices 230 for moving air flow from an air inlet side to an air outlet side across one or more drawer units 240 containing heat-generating electronic components to be cooled. In this embodiment, a front cover 250 attached to the rack covers the air inlet side, a back cover 255 attached to the rack covers the air outlet side, and a side car disposed adjacent to (and/or attached to) the rack includes a heat exchanger 260 for cooling air circulating through the rack unit. Further, in this embodiment, the liquid-to-liquid heat exchangers 210 are multiple computer room water-conditioning (CRWC) units which are coupled to receive building chilled facility water 200. The building chilled facility water is used to cool the system coolant within system coolant loop 211, which is circulating through air-to-liquid heat exchanger 260. The rack unit in this example is assumed to comprise a substantially enclosed housing, wherein the same air circulates through the housing that passes across the air-to-liquid heat exchanger 260. In this manner, heat generated within the electronics rack is removed from the enclosed housing via the system coolant loop, and transferred to the facility coolant loop for removal from the computer installation room.

FIG. 3 depicts another embodiment of a rack-level, liquid coolant cooling solution, which again uses chilled facility water to remove heat from the computer installation room, thereby transferring the cooling burden from the air-conditioning unit(s) to the building's chilled water coolers. In this implementation, one embodiment of a coolant distribution unit 300 for a data center is illustrated. Within coolant distribution unit 300 is a power/control element 312, a reservoir/expansion tank 313, a liquid-to-liquid heat exchanger 314, a pump 315 (often accompanied by a redundant second pump), facility water inlet 316 and outlet 317 supply pipes, a supply manifold 318 supplying water or system coolant to the electronics racks 110 via couplings 320 and lines 322, and a return manifold 319 receiving water or system coolant from the electronics racks 110, via lines 323 and couplings 321. Each electronics rack includes (in one example) a power/control unit 330 for the electronics rack, multiple electronic systems or subsystems 340, a system coolant supply manifold 350, and a system coolant return manifold 360. As shown, each electronics rack 110 is disposed on raised floor 140 of the data center with lines 322 providing system coolant to system coolant supply manifolds 350 and lines 323 facilitating return of system coolant from system coolant return manifolds 360 being disposed in the supply air plenum beneath the raised floor.

In the embodiment illustrated, system coolant supply manifold 350 provides system coolant to cooling apparatuses disposed within the electronic systems or subsystems (for example, to liquid-cooled cold plates or cold rails) via flexible hose connections 351, which are disposed between the supply manifold and the respective electronic systems within the rack. Similarly, system coolant return manifold 360 is coupled to the electronic systems via flexible hose connections 361. Quick connect couplings may be employed at the interface between flexible hoses 351, 361 and the individual electronic systems. By way of example, these quick connect couplings may comprise various types of commercially available quick connect couplings.

Although not shown, electronics rack 110 may also include an air-to-liquid heat exchanger, for example, disposed at an air outlet side thereof, which also receives system coolant from the system coolant supply manifold 350 and returns system coolant to the system coolant return manifold 360.

FIG. 4 illustrates another embodiment of a coolant-cooled electronics rack and cooling system therefor, in accordance with one or more aspects of the present invention. In this embodiment, the electronics rack 400 has a side car structure 410 associated therewith or attached thereto, which includes an air-to-coolant heat exchanger 415 through which air circulates from an air outlet side of electronics rack 400 towards an air inlet side of electronics rack 400, for example, in a closed loop path in a manner similar to that illustrated above in connection with the cooling implementation of FIG. 2. In this example, the cooling system comprises an economizer-based, warm-liquid coolant loop 420, which comprises multiple coolant tubes (or lines) connecting, in the example depicted, air-to-liquid heat exchanger 415 in series fluid communication with a coolant supply manifold 430 associated with electronics rack 400, and connecting in series fluid communication, a coolant return manifold 431 associated with electronics rack 400, a cooling unit 440 of the cooling system, and air-to-liquid heat exchanger 415.

As illustrated, coolant flowing through warm-liquid coolant loop 420, after circulating through air-to-liquid heat exchanger 415, flows via coolant supply plenum 430 to one or more electronic systems of electronics rack 400, and in particular, one or more cold plates and/or cold rails 435 associated with the electronic systems, before returning via coolant return manifold 431 to warm-liquid coolant loop 420, and subsequently to a cooling unit 440 disposed (for example) outdoors from the data center. In the embodiment illustrated, cooling unit 440 includes a filter 441 for filtering the circulating liquid coolant, a condenser (or air-to-liquid heat exchanger) 442 for removing heat from the liquid coolant, and a pump 443 for returning the liquid coolant through warm-liquid coolant loop 420 to air-to-liquid heat exchanger 415, and subsequently to the liquid-cooled electronics rack 400. By way of example, hose barb fittings 450 and quick disconnect couplings 455 may be employed to facilitate assembly or disassembly of warm-liquid coolant loop 420.

In one example of the warm coolant-cooling approach of FIG. 4, ambient temperature might be 30° C., and coolant temperature 35° C. leaving the air-to-liquid heat exchanger 442 of the cooling unit. The cooled electronic system depicted thus facilitates a chiller-less data center. Advantageously, such a liquid-cooling solution provides highly energy efficient cooling of the electronic systems of the electronics rack, using liquid (e.g., water), that is cooled via circulation through the air-to-liquid heat exchanger located outdoors (i.e., a dry cooler) with external ambient air being pumped through the dry cooler. Note that this warm coolant-cooling approach of FIG. 4 is presented by way of example only. In alternate approaches, cold coolant-cooling could be substituted for the cooling unit 440 depicted in FIG. 4. Such cold coolant-cooling might employ building chilled facility coolant to cool the liquid coolant flowing through the liquid-cooled electronics rack, and associated air-to-liquid heat exchanger (if present), in a manner such as described above in connection with FIGS. 2 & 3.

Figure 5B:
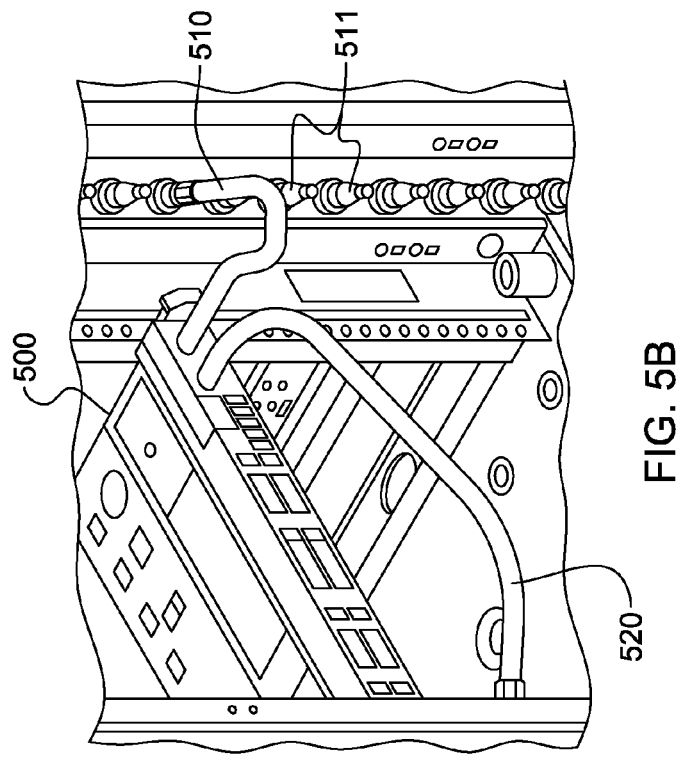
FIG. 5B is a partial depiction of a more detailed embodiment of the rack-level coolant distribution structures illustrated in FIG. 5A, in accordance with one or more aspects of the present invention.
Figure 5A:
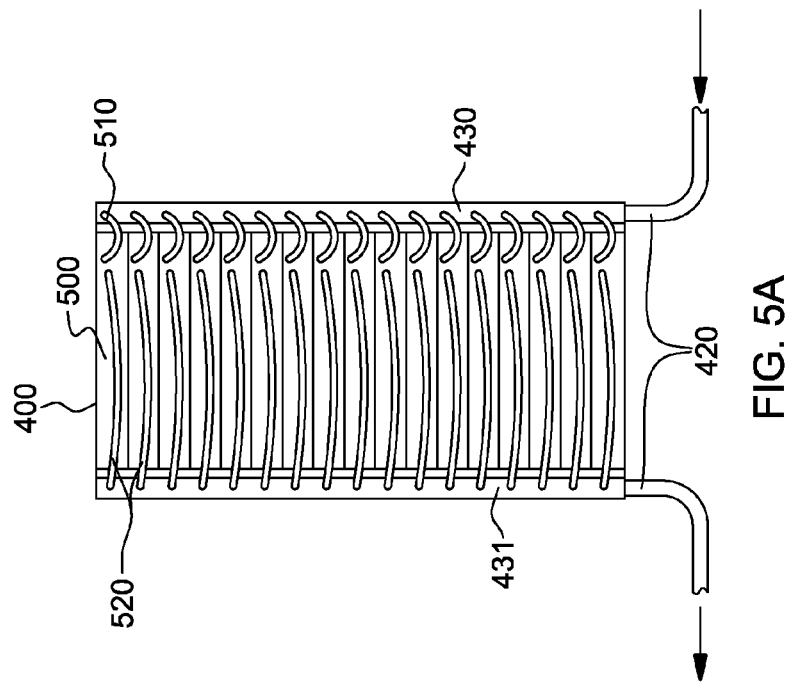
FIG. 5A is a more detailed, elevational view of one embodiment of the liquid-cooled electronics rack of FIG. 4, and illustrating rack-level coolant distribution structures, in accordance with one or more aspects of the present invention.

FIGS. 5A & 5B depict in greater detail one embodiment of a coolant-cooled electronics rack, such as depicted in FIG. 4, in accordance with one or more aspects of the present invention. In this implementation, coolant-cooled electronics rack 400 comprises a plurality of electronic systems 500, within which one or more electronic components are to be liquid-cooled via, for example, one or more cold plates or cold rails, as described below. The cooling system includes coolant loop 420 coupled in fluid communication with coolant supply manifold 430 and coolant return manifold 431, both of which may comprise vertically-oriented manifolds attached to coolant-cooled electronics rack 400. In this embodiment, the rack-level coolant distribution system further includes individual node-level supply hoses 510 supplying coolant from coolant supply manifold 430 to cold plates and cold rails within the electronic systems 500. As shown in FIG. 5B, coolant supply manifold 430 may be (in one embodiment) a vertically-oriented manifold with a plurality of coupling connections 511 disposed along the manifold, one for each electronic system 500 having one or more electronic components to be coolant-cooled. Coolant leaves the individual electronic systems 500 via node-level return hoses 520, which couple the individual electronic systems (or nodes) to coolant return manifold 431, and hence, to coolant loop 420. In the embodiment illustrated in FIG. 4, relatively warm coolant, such as water, is supplied from the cooling unit, either directly, or through one or more air-to-coolant heat exchanger(s) 415 (of FIG. 4), and hot coolant is returned via the coolant return manifold to the cooling unit. In one embodiment of the rack-level coolant distribution system illustrated in FIGS. 5A & 5B, the node-level supply and return hoses 510, 520 are flexible hoses.

Figure 6:
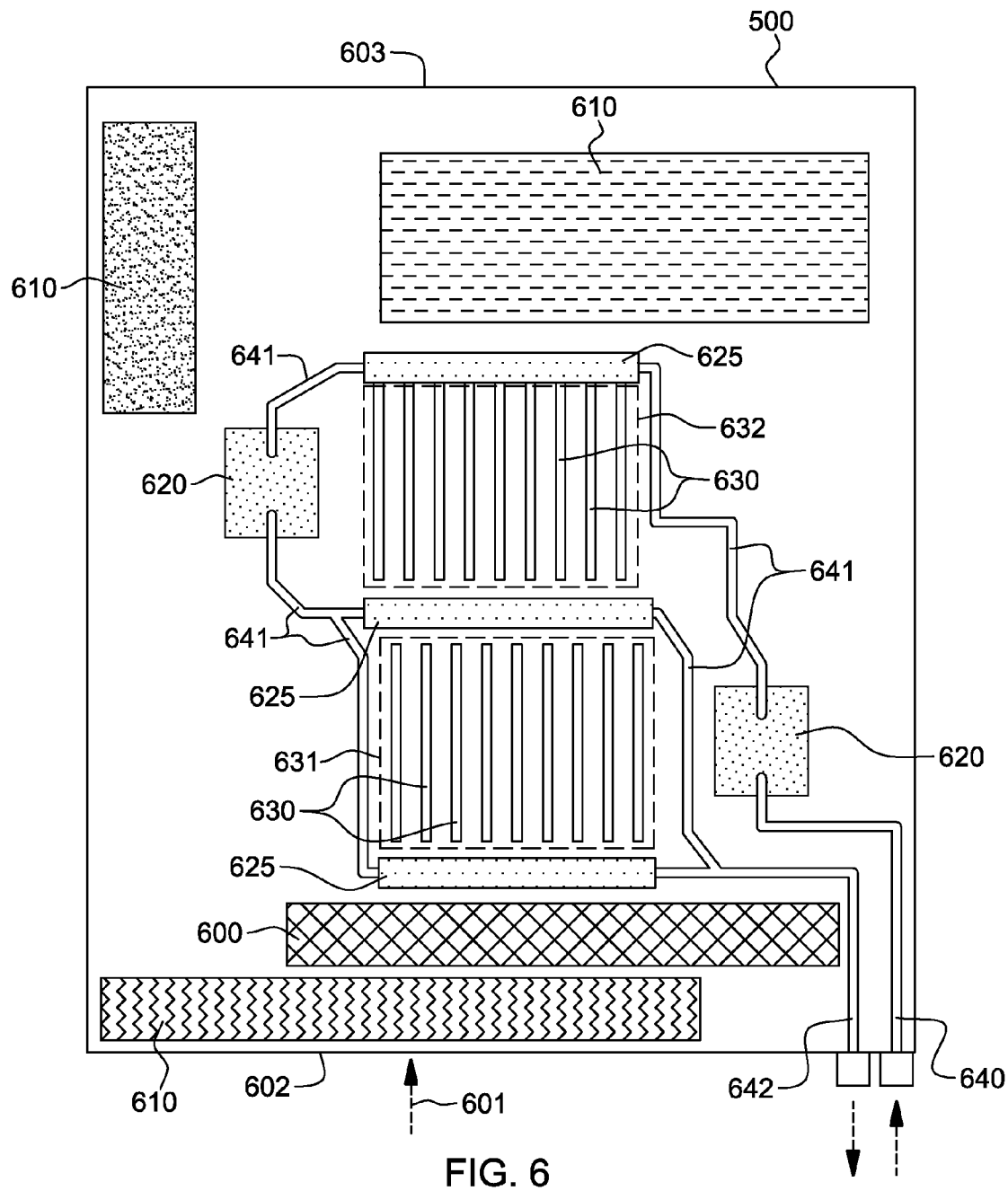
FIG. 6 is a plan view of one embodiment of an electronic system layout for a liquid-cooled electronics rack, and illustrating multiple liquid-cooled cold plates and multiple liquid-cooled cold rails coupled in fluid communication, in accordance with one or more aspects of the present invention.

FIG. 6 illustrates one embodiment of a cooled electronic system 500 component layout, wherein one or more air-moving devices 600 provide forced air flow 601 to cool multiple components 610 within electronic system 500. Cool air is taken in through a front 602 and exhausted out a back 603 of the electronic system (or drawer). The multiple components to be cooled include, for example, multiple processor modules to which coolant-cooled cold plates 620 (of the coolant-based cooling apparatus) are coupled, as well as multiple arrays 631, 632 of electronics cards 630 (e.g., memory modules such as dual in-line memory modules (DIMMs)), which are to be thermally coupled to one or more coolant-cooled cold rails 625. As used herein "thermally coupled" refers to a physical thermal transport path being established between components, for example, between an electronics card and a coolant-cooled cold rail for the conduction of heat from one to the other.

The illustrated liquid-based cooling approach further includes multiple coolant-carrying tubes connecting in fluid communication coolant-cooled cold plates 620 and coolant-cooled cold rails 625. These coolant-carrying tubes comprise (for example), a coolant supply tube 640, multiple bridge tubes 641, and a coolant return tube 642. In the embodiment illustrated, bridge tubes 641 connect one coolant-cooled cold rail 625 in series between the two coolant-cooled cold plates 620, and connect in parallel two additional coolant-cooled cold rails 625 between the second coolant-cooled cold plate 620 and the coolant return tube 642. Note that this configuration is provided by way of example only. The concepts disclosed herein may be readily adapted to use with various configurations of cooled electronic system layouts. Note also, that as depicted herein, the coolant-cooled cold rails are elongate, thermally conductive structures comprising one or more channels through which coolant passes, for example, via one or more tubes extending through the structures. The coolant-cooled cold rails are disposed, in the embodiment illustrated, at the ends of the two arrays (or banks) 631, 632 of electronics cards 630, and multiple thermal spreaders are provided coupling in thermal communication electronics cards 630 and coolant-cooled cold rails 625. Various such thermal transfer structures are discussed below with reference to FIGS. 8A-17B.

Figure 7:
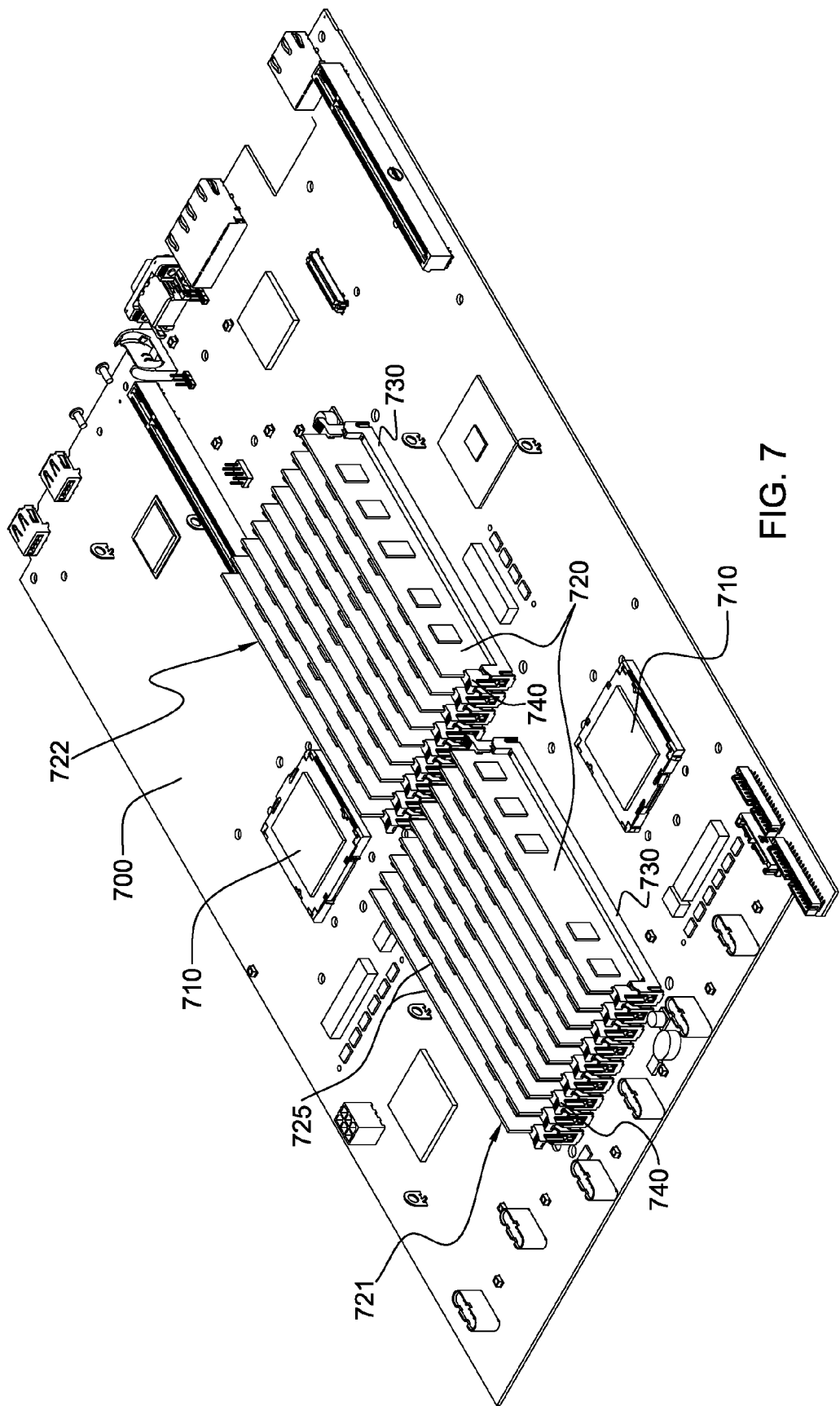
FIG. 7 depicts one detailed embodiment of a partially assembled electronic system, wherein the electronic system includes multiple different types of heat-generating electronic devices to be cooled, in accordance with one or more aspects of the present invention.

FIG. 7 depicts in greater detail one embodiment of an electronic system layout comprising a printed circuit board 700 with two processor modules 710, each of which is to have a respective coolant-cooled cold plate of a coolant-based cooling system coupled thereto, and multiple arrays 721, 722 of electronics cards 720, such as memory cards comprising memory modules on opposite first and second sides thereof. Electronics cards 720 are held in respective sockets 730, mounted to printed circuit board 700, and latches 740 at the ends of sockets 730 facilitate securing (or removing) of electronics cards 720 within (or from) the respective sockets 730. The cooling apparatus embodiments described hereinbelow advantageously facilitate, for example, liquid-cooling of electronics cards 720 without interfering with an operator's access to latches 740 at the ends of sockets 730. In addition to existing component constraints on the surface of printed circuit board 700, there is assumed to be negligible space between a cover (not shown) of the electronic system (e.g., server), and the top edge surfaces 725 of electronics cards 720.

FIGS. 8A-8D depicts a partial assembly of a cooled electronic system comprising the electronic system layout of FIG. 7, including printed circuit board 700, processor modules 710, and arrays 721, 722 of electronics cards 720. Electronics cards 720 are each shown positioned within a respective socket 730 mounted to printed circuit board 700, with latches 740 being disposed at the opposite ends of each socket 730. Latches 740 facilitate securing (or removing) electronics cards 720 within (or from) the sockets.

FIGS. 8A-8D further depict multiple coolant-cooled cold rails 800, 810, 820, shown positioned at the ends of the elongate sockets 730 of the two arrays 721, 722 of electronics cards 720. Advantageously, these coolant-cooled cold rails are configured and positioned to not interfere with opening and closing of latches 740. The multiple cold rails include a first coolant-cooled cold rail 800, disposed at one end of sockets 730 in the first array 721 of electronics cards 720, a second coolant-cooled cold rail 810 disposed between the two arrays 721, 722 of electronics cards 720, and a third coolant-cooled cold rail 820 disposed at the other end of sockets 730 of the second array 722 of electronics cards 720. Holes 830 are provided within each of the cold rails. In one embodiment, these holes may comprise threaded holes in the cold rails which facilitate attachment of the thermal spreaders (not shown) to the respective cold rails, as described further below.

Figure 8A:
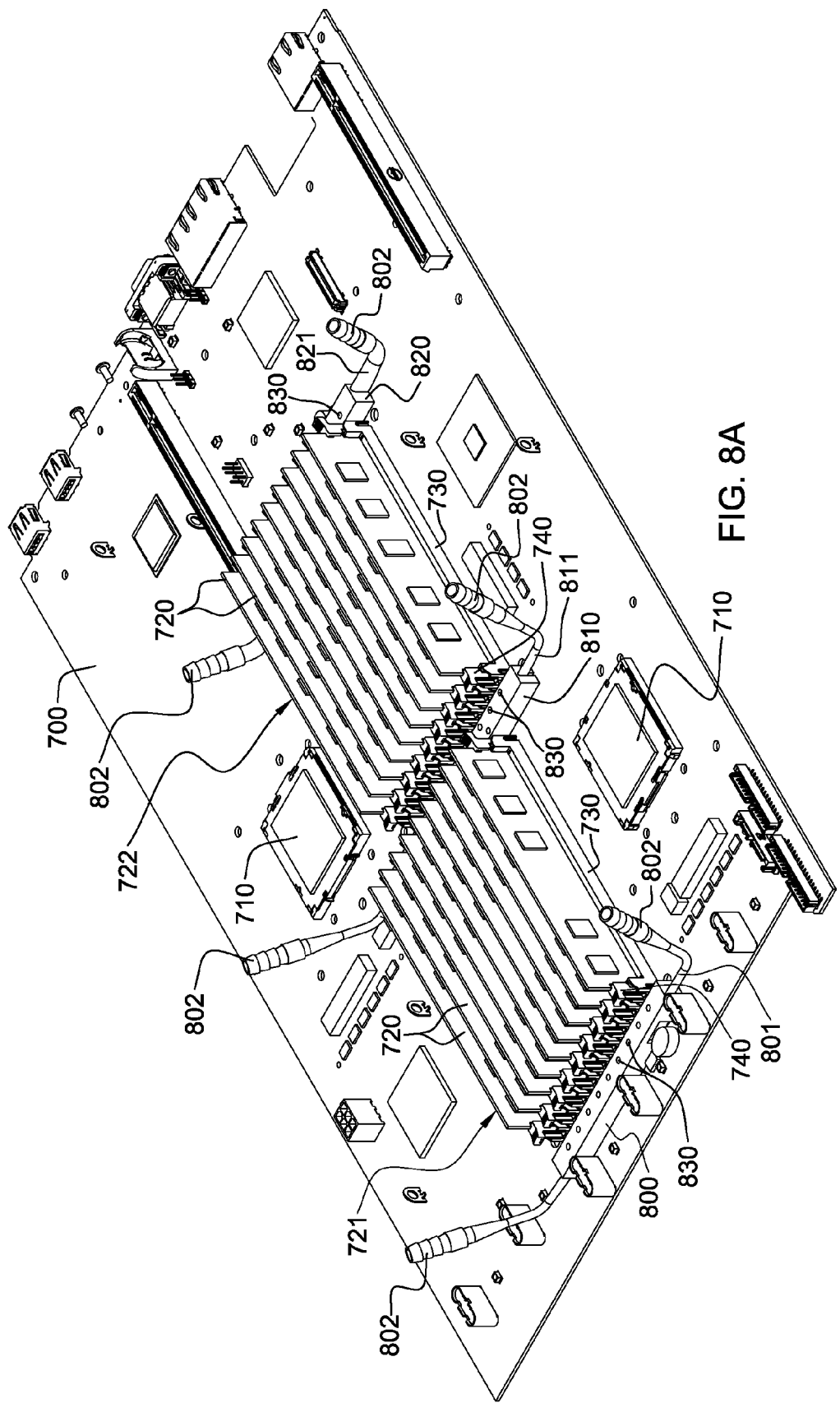
FIG. 8A depicts the electronic system of FIG. 7, with first, second and third liquid-cooled cold rails of a cooling apparatus shown in place at the ends of first and second arrays of sockets and electronics cards of the electronic system, in accordance with one or more aspects of the present invention.

In FIG. 8B, first coolant-cooled cold rail 800 is illustrated in greater detail at the one end of the sockets 730 of the first array 721 of electronics cards 720. Each cold rail may be a thermally conductive structure with at least one coolant-carrying channel extending therein. In this example, the coolant-carrying channel is a flattened tube 801 that is vertically-oriented within the cold rail and offset from holes 830. As shown, first coolant-cooled cold rail 800 is sized (in this example) to fit between sockets 730, and one or more fan sockets 805. In addition, the cold rail may be selectively recessed at its bottom surface and/or one or more side surfaces to clear any interfering components, such as capacitors or chips, on the printed circuit board. The flattened tube 801 extending through the thermally conductive structure of the cold rail may comprise (as one example) a flattened ⅛ inch pipe, which may be routed above any intrusive elements on the board. In the example illustrated, barbed fittings 802 (FIG. 8A) are shown provided at the ends of flattened tube 801.

In FIG. 8C, second coolant-cooled cold rail 810 is illustrated in greater detail. This cold rail is configured and sized to fit between the two arrays 721, 722 of electronics cards. Two rows of holes 830 are provided within second coolant-cooled cold rail 810 to facilitate coupling of thermal spreaders from the different arrays to the cold rail. In order to clear the holes in the cold rail, a vertically-oriented, flattened pipe 811 passing through cold rail 810 is positioned within a slot 813 cut in the middle of the cold rail, for example, from the lower surface of the cold rail into the thermally conductive structure. By way of example, flattened tube 811 may be a flattened ⅛ inch pipe. Quick disconnect couplings 802 may also be provided for connecting flattened tube 811 in fluid communication with other coolant-carrying tubes, such as the bridging tubes described above in connection with FIG. 6.

FIG. 8D illustrates in greater detail one embodiment of third coolant-cooled cold rail 820 disposed at the other end of the second array 722 of electronics cards 720. As illustrated, third coolant-cooled cold rail 820 is positioned to not interfere with opening or closing of latches 740 at the other end of sockets 720 in the second array 722. The cold rail includes a series of holes 830, which will facilitate coupling thermal spreaders (not shown) to the cold rail, and accommodates a flattened tube 821, which is vertically aligned within an appropriately-sized slot 823 in the thermally conductive structure of the cold rail and is offset from the series of holes 830. This cold rail may again be selectively recessed at its lower surface and/or side surfaces to clear any interfering components on printed circuit board 700.

In the example of FIG. 8D, and assuming the cooling implementation depicted in FIG. 6, the tube through which coolant flows may be a flattened, ¼ inch pipe, routed away from any intrusive elements on the printed circuit board. As illustrated in FIG. 8A, quick disconnect couplings 802 may be provided at the ends of flattened tube 820 to facilitate coupling of the tube in fluid communication with other tubes of the liquid-based cooling approach discussed above in connection with FIG. 6. As illustrated in FIGS. 8A-8D, each coolant-cooled cold rail 800, 810, 820 may be unique in terms of its location on the circuit board, and uniquely configured due to existing constraints within the different areas of the printed circuit board. These coolant-cooled cold rails are, in one embodiment, coupled to either a cold liquid cooling loop or a warm-liquid cooling loop, depending on the cooling approach desired, as described above.

FIGS. 9A-9D depict one embodiment of a cooled electronic system comprising the electronic subassembly of FIGS. 8A-8D, with a plurality of thermal spreaders shown positioned between and in physical and thermal contact with the electronics cards of the arrays (or banks) of electronics cards. These thermal spreaders provide a thermal coupling or thermal conduction path from the electronics cards, for example, the memory modules on the opposite sides of the electronics cards, to the coolant-cooled cold rails to facilitate cooling of the electronics cards via conductive heat transfer to the cold rails, and hence to the coolant flowing through the cold rails.

In the embodiment illustrated, each thermal spreader comprises a first thermal transfer plate 910 and a second thermal transfer plate 920. The first thermal transfer plate comprises a first thermal conduction surface, and the second thermal transfer plate 920 comprises a second thermal conduction surface. The first thermal conduction surface and the second thermal conduction surface are in spaced, opposing relation, and are configured to accommodate a respective electronics card 720 therebetween, with the first thermal conduction surface physically and thermally coupled to at least one first surface on one side of the electronics card 720, and the second thermal conduction surface physically and thermally coupled to at least one second surface on the other side of the electronics card 720. These first and second surfaces on the different sides of the electronics card may comprise, in one example, surfaces of one or more electronics devices, such as memory modules, mounted on the different sides of the respective electronics card.

Further, the first thermal transfer plate 910 and second thermal transfer plate 920 each comprise a first end edge 915, and a second end edge 916, disposed at opposite ends of the respective socket 730. Each thermal transfer plate is a thermally conductive structure formed (in one example) as an elongate, flat plate. In this example, thermally conductive extensions 912, 922 and 913, 923 are provided extending from the first and second end edges 915, 916 of each thermal transfer plate 910, 920.

Figure 9A:
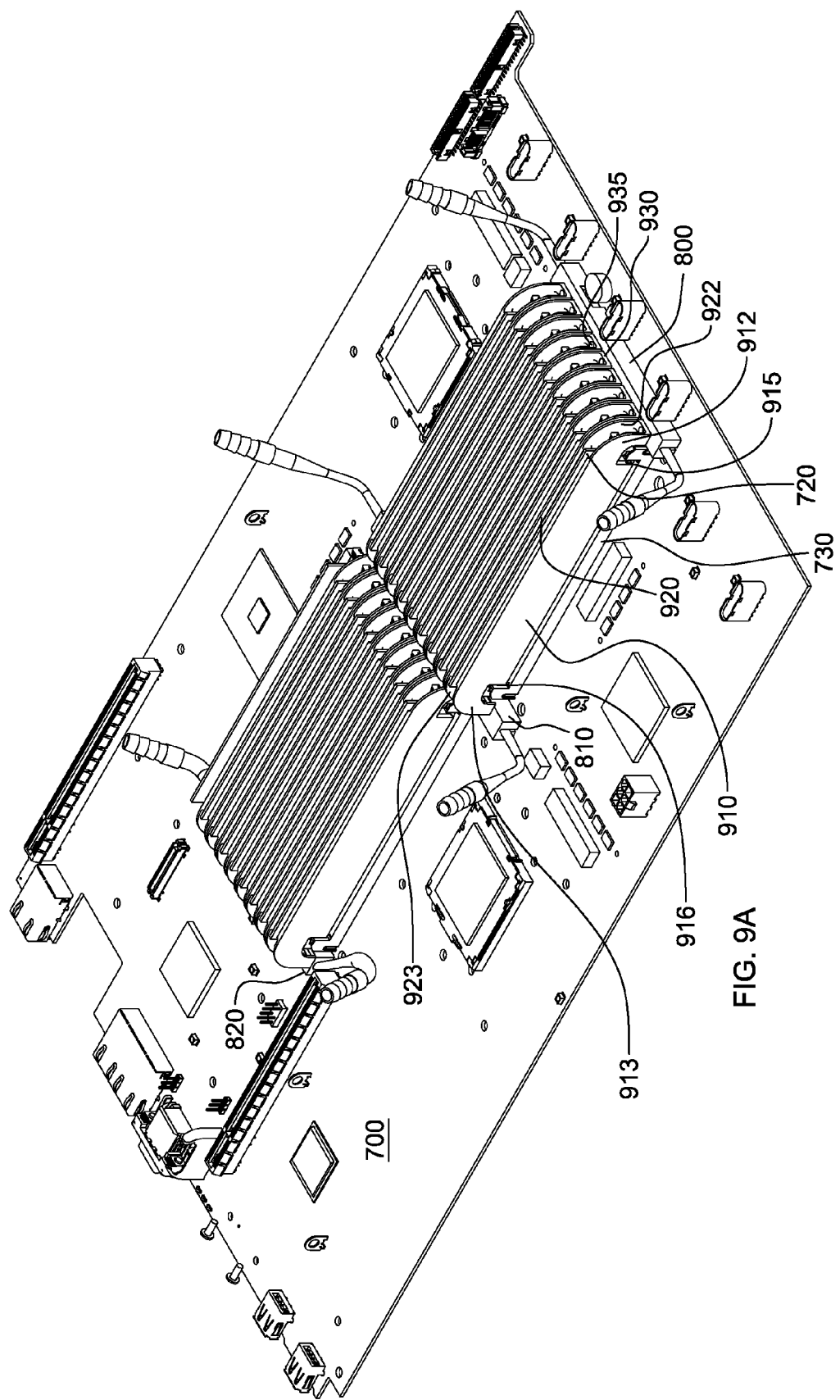
FIG. 9A depicts the partially assembled, cooled electronic system of FIGS. 8A-8D, with a plurality of thermal spreaders shown coupled to the electronics cards and thermally interfacing the electronics cards to respective liquid-cooled cold rails, in accordance with one or more aspects of the present invention.
Figure 9B:
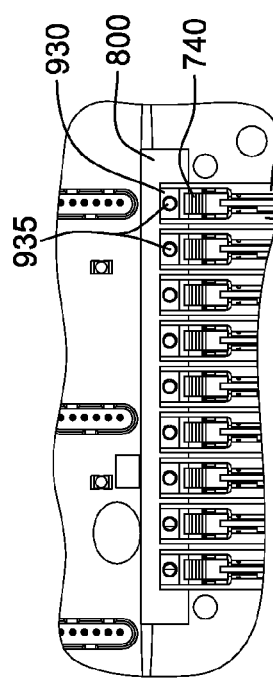
FIG. 9B is a partial depiction of the cooled electronic system of FIG. 9A, and illustrating interfacing of thermal spreaders to the first liquid-cooled cold rail at the one end of the sockets of the first array of electronics cards, in accordance with one or more aspects of the present invention.
Figure 9C:
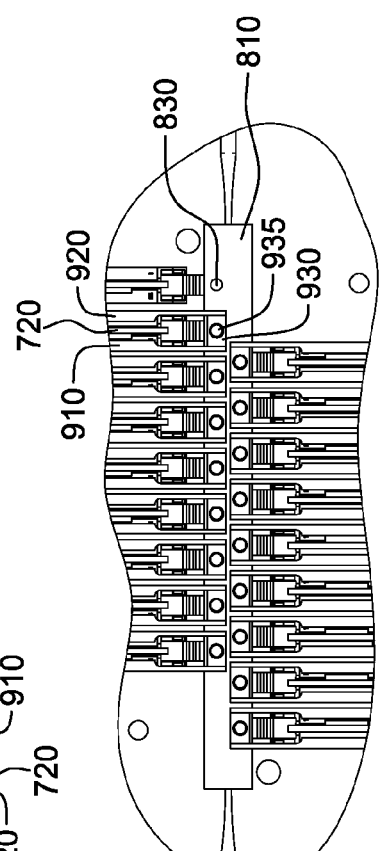
FIG. 9C is a partial depiction of the cooled electronic system of FIG. 9A, and illustrating the second liquid-cooled cold rail disposed between the first and second arrays of electronics cards, and showing interfacing of thermal spreaders coupled to the first array of electronics cards, and thermal spreaders coupled to the second array of electronics cards to the second liquid-cooled cold rail, in accordance with one or more aspects of the present invention.
Figure 9D:
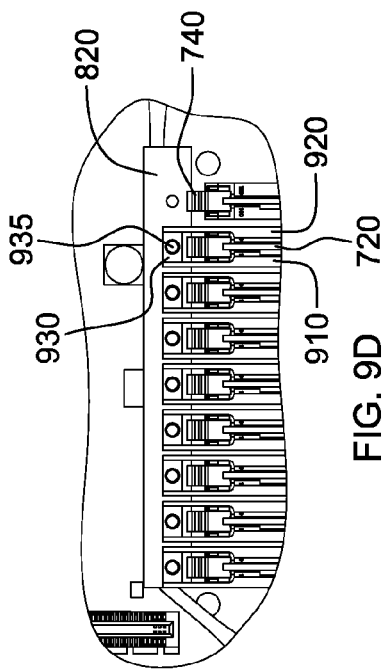
FIG. 9D is a partial depiction of the cooled electronic system of FIG. 9A, and illustrating interfacing of thermal spreaders associated with the second array of electronics cards to the third liquid-cooled cold rail of the cooled electronic system, in accordance with one or more aspects of the present invention.

In one embodiment, these extensions 912, 922 and 913, 923 are curved extensions, which may be characterized, in one embodiment, as "elephant trunk-shaped extensions". In particular, a first thermally conductive extension 912 is a curved extension which extends from and upper portion of first thermal transfer plate 910 at the first end edge thereof 915, and a similar, second thermally conductive extension 922 extends from the first end edge 915 of second thermal transfer plate 920. In addition, a third thermally conductive extension 913 extends from the second end edge 916 of first thermal transfer plate 910, and a fourth thermally conductive extension 923 extends from the second end edge 916 of second thermal transfer plate 920. The thermally conductive extensions 912, 922 at the first end edge 915 of the first and second thermal transfer plates 910, 920 are spaced apart to allow access to the respective socket latch at the end of the socket 730 containing the electronics card 720 sandwiched by the plates of the thermal spreader. Similarly, the thermally conductive extensions 913, 923 at the second end edges 916 of the first and second thermal transfer plates 910, 920 are spaced apart to allow access to the latch disposed at the other end of the socket. In this embodiment, the extensions 912, 922 and 913, 923 are joined at their ends, and connected to the respective cold rail by respective connecting flanges 930, each of which includes an opening 935, aligned to an underlying opening 830 in the adjacent cold rail 800, 810, 820. FIGS. 9B-9D illustrate these structures in greater detail, with the thermal spreaders 900 shown ready to be fastened to the respective cold rails using, for example, a threaded fastener.

As explained above, heat is transferred from the heat-generating components of the electronics card (for example, memory modules) to the conduction surfaces of the thermal transfer plates, across the thermal transfer plates to the thermally conductive extensions at the ends thereof, and from the thermally conductive extensions into the respective coolant-cooled cold rails. From the coolant-cooled cold rails, the heat is rejected to coolant flowing through the channels or tubes extending through the cold rails, and subsequently, is removed from the cooled electronic system in a manner such as, for example, explained above in connection with FIGS. 4-6.

Note that in the embodiment depicted in FIGS. 9A-9D, the connecting flanges 930 at the ends of the thermally conductive extensions (where contacting the respective cold rails), are solid connecting structures, meaning that the thermal spreaders are (in one embodiment) single-piece structures. Also, note that, in the approach depicted, heat is conducted by the thermal transfer plates to each end edge of the plates, and in particular, to the thermally conductive extensions extending from the respective end edges to the two cold rails disposed at the opposite ends of the respective sockets in an array (or bank) of electronics cards. These thermally conductive extensions and connecting flanges physically and thermally couple to the upper surface of the respective cold rails. As illustrated in the plan views of FIGS. 9B-9D, the latches for the respective sockets remain accessible by appropriately spacing each pair of thermally conductive extensions to the first and second sides of the latches at issue. This can be accomplished, in part, by reducing the thickness of the extensions compared with the thickness of the plates, as shown in the plan views of FIGS. 9B-9D.

FIGS. 10A-11C depict an alternate embodiment of a thermal spreader, which may be employed in a cooled electronic system such as depicted in FIGS. 9A-9D.

In FIGS. 10A & 10B, the cooled electronic system of FIGS. 9A-9D is again illustrated, wherein the first, second and third coolant-cooled cold rails 800, 810, 820 are shown in position, and a plurality of thermal spreaders 1000 are illustrated positioned about respective electronics cards of the electronic system. In this embodiment, the thermal spreaders are divided in half, thus comprising two separate thermal transfer plates, each configured substantially as described above in connection with the embodiment of FIGS. 9A-9D. In this embodiment, however, the thermal spreaders lack the connecting flanges at the ends of the thermally conductive extensions. Instead, two separate flanges (discussed below) extend from the respective thermally conductive extensions inwards towards the other extension. These flanges are sized and configured (in one embodiment) to mate when the thermal spreader is assembled about the respective electronics card. Aligning of the thermal transfer plates, as well as aligning of the thermal transfer plates and the electronics card, can be facilitated by providing appropriate alignment features on the plates and card. The flanges may also be curved at their ends to define an opening when positioned, as illustrated in FIGS. 10A-10B. The two halves (or two thermal transfer plates) of the thermal spreader 1000 are clipped together, with each shown positioned in physical and thermal contact with one side of the respective electronics card. In this embodiment, multiple retaining clips 1030 are illustrated. These retaining clips 1030 hold the plates of the thermal spreader in physical contact with respective sides of the electronics card during assembly of the cooled electronic system. As explained above, the thermally conductive extensions from the ends of the thermal spreader are spaced and configured to not to interfere with normal operation of the latches at the ends of the sockets within which the electronics cards are positioned. Each latch is thus accessible and facilitates securing of the electronics card within the socket or removal of the electronics card from the socket without requiring removal of the coolant-cooled cold rail, or without requiring removal of the thermal spreader.

In FIGS. 11A & 11B, one thermal transfer plate (i.e., half of the thermal spreader 1000 of FIGS. 10A & 10B) is illustrated. Referring collectively to FIGS. 11A & 11B, thermal transfer plate 1010 includes a first thermal conduction surface 1100, configured to physically and thermally couple to one or more surfaces of one or more heat-generating components on one side of the electronics card, for example, one or more memory modules disposed on one side of the electronics card. Extending from a first end edge 1101 of thermal transfer plate 1010 is a first thermally conductive extension 1110, and extending from the other end edge 1102 of thermal transfer plate 1010 is a second thermally conductive extension 1120. As noted above, in the one embodiment, these extensions are curved, for example, to avoid contact with the respective socket within which the electronics card is to be positioned. Flanges 1103, 1104 respectively extend inwards from thermally conductive extensions 1110, 1120. In the illustrated embodiment, these flanges 1103, 1104 are curved at their ends to define half of an opening sized and configured to align to an opening in the respective coolant-cooled cold rail to which the thermally conductive extensions and flanges of the thermal spreader are to physically couple. The other half of the thermal spreader is a mirror image of thermal transfer plate 1010, such that the two thermal transfer plates have opposing first and second thermal conduction surfaces, between which the respective electronics card is sandwiched (as illustrated in FIG. 11C). The thermal transfer plates and flanges are configured with appropriate thicknesses and dimensions so that when the thermal transfer plates sandwich the electronics card, the flanges from the thermally conductive extensions at respective ends of the card meet and their curved surfaces define the openings that align with the openings in the adjacent coolant-cooled cold rail. As illustrated in this configuration, the thickness of the thermal transfer plates may be different from that of the thermally conductive extensions, for example, to facilitate providing sufficient room around the corresponding latches to allow user access and operation of the latches, without requiring disassembly of the thermal spreader.

FIG. 11C illustrates the assembled thermal spreader held in place about the electronics card via an appropriate clipping mechanism, such as spring clips 1130. As illustrated in this figure, a lower portion of the electronics card remains exposed to facilitate insertion of the electronics card within the respective socket on the printed circuit board of the electronic system. Also note that (in one embodiment), the thermal spreaders may be fabricated of a metal material, such as copper.

FIGS. 12A-17B depict various alternate embodiments of a cooling apparatus, and cooled electronic system, in accordance with one or more aspects of the present invention. Generally stated, in these embodiments, the cooling apparatus comprises one or more thermal transfer structures (or assemblies) which are, for example, fixedly secured to one or more cold rails at the ends thereof and/or fixedly coupled via one or more tubes to respective coolant inlet and outlet manifolds. These thermal transfer structures facilitate dissipation of heat from one or more electronics cards (such as the chips or modules of one or more DIMMs) to, for example, liquid coolant. In the embodiments disclosed herein, the thermal transfer structures are, by way of example, metallurgically bonded to the cold rails and/or coolant manifolds, and form part of the cooling apparatus which, in one embodiment, is fabricated as an integrated or monolithic structure that may be secured as a single unit or piece within an electronic system (such as a server node).

Advantageously, the cooling apparatus embodiments described hereinbelow with reference to FIGS. 12A-17B require no disassembly to allow for docking or undocking of the adjacent electronics cards within the corresponding sockets of the electronic system, and also provide sufficient room around the latches of the sockets to allow operator access and operation of the latches.

The cooling apparatuses disclosed hereinbelow each include one or more thermal transfer structures configured to engage one or more electronics cards (comprising, in one embodiment), a plurality of memory modules, such as one or more dual in-line memory modules (DIMMs), with docking of the electronics card(s) within a respective socket(s) of the electronic system, such as described above. A thermal transfer structure comprises a thermal spreader and a thermally conductive spring assembly secured to the thermal spreader. The thermal spreader may take different forms, including a thermal spreader or transfer plate, or may comprise a flattened tube section through which coolant may flow. The thermally conductive spring assembly may be (in one embodiment) metallurgically bonded to a thermal conduction surface of the thermal spreader, and be positioned and configured to reside between and physically couple with a spring force a first surface of an electronics card to the thermal conduction surface of the thermal spreader with docking of the electronics card within a respective socket, and thereby facilitate conduction of heat from the electronics card to the thermal spreader through the spring assembly. Note that used herein, metallurgically bonded refers (by way of example) to a solder, braze or weld connection, wherein there is a good thermal interface for the conduction of heat across the bond from one structure to the other structure. In operation, the thermal transfer structure facilitates dissipation of heat from the electronics card to coolant flowing through one or more coolant-cooled structures, such as cold rails or coolant manifolds disposed, in one embodiment, at the ends of an array of card-receiving sockets within the electronic system.

FIG. 12A depicts one embodiment of a thermal transfer structure 1200 for a cooling apparatus such as disclosed herein. Thermal transfer structure 1200 includes (by way of example) a thermal spreader 1210 configured, in this embodiment, as a thermal spreader plate. The thermal spreader further includes a first thermal conduction surface 1211 and a second thermal conduction surface 1212 disposed on opposite sides of the thermal spreader 1210. Thermally conductive extensions 1215 extend from the thermal transfer plate at the end edges thereof to facilitate coupling of the thermal transfer structure to, for example, respective cold rails disposed at the ends of an electronics card array, wherein the cold rails comprise coolant-cooled structures, each comprising a thermally conductive structure with at least one coolant-carrying channel extending therein. Advantageously, thermal transfer structure 1200 may be fixedly secured to the respective cold rails by, for example, metallurgical bonding via soldering, brazing or welding the thermally conductive extensions to the respective cold rails.

Thermal transfer structure 1200 further includes a thermally conductive spring assembly 1220 coupled to first thermal conduction surface 1211 of thermal spreader 1210. Although not shown, a second thermally conductive spring assembly could, depending on the implementation, also be secured to second thermal conduction surface 1212 of thermal spreader 1210. In one embodiment, thermally conductive spring assembly 1220 may be fabricated of metal and be metallurgically bonded to first thermal conduction surface 1211 of thermal spreader 1210. Thermally conductive spring assembly 1220 may take various configurations. In FIG. 12A, the thermally conductive spring assembly 1220 comprises multiple C-shaped, dual compression springs 1225 spaced apart via reliefs 1226 to allow the compression springs 1225 to move independently. In this manner, the thermally conductive spring assembly 1220 may provide good thermal conduction contact to the card surface by adjusting to differently positioned and sized chips or modules on the electronics card which the thermal transfer structure is to engage with docking of the electronics card within a respective socket of the electronic system.

FIGS. 12B & 12C depict alternate embodiments of the thermal transfer structure of FIG. 12A. In FIG. 12B, a thermal transfer structure 1200' is presented which is substantially identical to that described above in connection with the embodiment of FIG. 12A, with an exception being that a differently configured, thermally conductive spring assembly is utilized. In this embodiment, a first thermally conductive spring assembly 1230 is secured to first thermal conduction surface 1211 and a second thermally conductive spring assembly 1231 is secured to second thermal conduction surface 1212 of thermal spreader 1210. The first and second thermally conductive spring assemblies each comprise, by way of example, upward-facing, U-shaped compression springs 1235, spaced apart by reliefs 1236 and disposed along the face of the first thermal conduction surface and the second thermal conduction surface, respectively.

In FIG. 12C, a thermal transfer structure 1200" is presented substantially identical to that of FIGS. 12A & 12B, with an exception being that another thermally conductive spring assembly 1240 is utilized, by way of example, on first thermal conduction surface 1211 of thermal spreader 1210. In this embodiment, thermally conductive spring assembly 1240 comprises a plurality of downward-facing, U-shaped compression springs 1245, spaced apart by reliefs 1246 so as to operate substantially independently when engaging structures on a surface of the adjacent electronics card, that is, with docking of the electronics card within an adjacent socket of the electronic system, as explained herein.

Those skilled in the art will note that the thermal transfer structures depicted in FIGS. 12A-12C are each configured and sized to advantageously provide a spring force to enhance physical contact between a surface of the adjacently-docked electronics card (not shown), which may comprise one or more integrated circuit chips or modules, and a thermal conduction surface of the thermal spreader. This spring force facilitates dissipation of heat from the electronics card into the thermal transfer structure by ensuring a good physical engagement, and thus a good thermal contact, between the two structures. As explained herein, the thermal transfer structure facilitates transfer of the heat to, for example, a coolant flowing through one or more coolant-cooled structures, as illustrated, by way of example, in FIG. 13.

Figure 13:
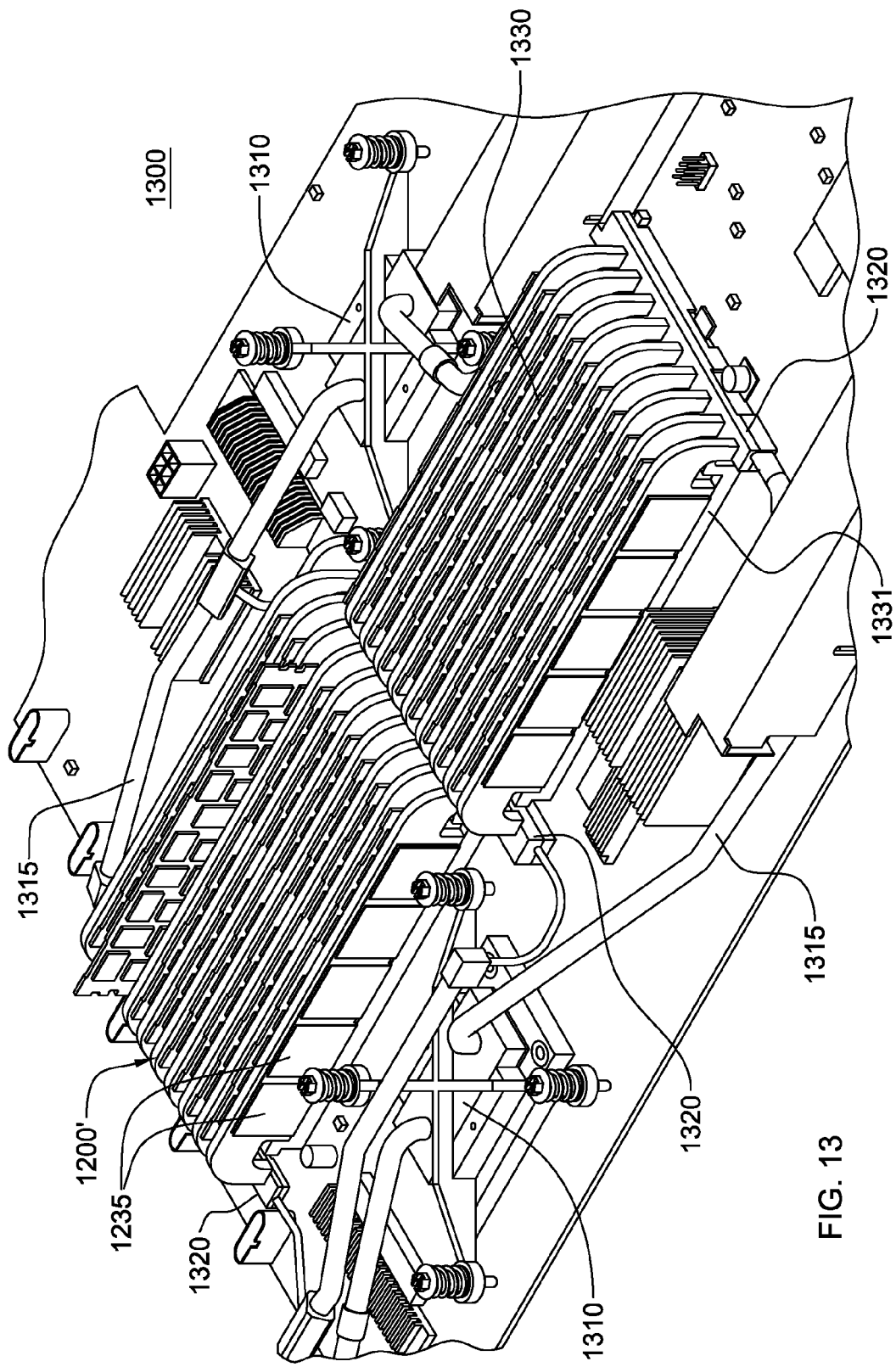
FIG. 13 is a partial depiction of a cooled electronic system comprising multiple electronics cards and a cooling apparatus, with a plurality of thermal transfer structures physically engaging the electronics cards and facilitating transfer of heat from the electronics cards to coolant flowing through one or more coolant-cooled structures, in accordance with one or more aspects of the present invention.

FIG. 13 depicts one embodiment of a cooled electronic system 1300 comprising a cooling apparatus which includes (by way of example only) multiple cold plates 1310, multiple cold rails 1320, and multiple coolant-carrying tubes 1315 coupling the cold plates and cold rails in fluid communication with a coolant inlet and a coolant outlet (not shown) to the cooled electronic system 1300. Coolant-cooled cold plates 1310 may be coupled to one or more high-heat-generating components, such as one or more processor modules, and the coolant-carrying tubes 1315 may be differently sized to accommodate a desired flow of coolant through, for example, the coolant-cooled cold rails 1320. A plurality of thermal transfer structures 1200', such as described above in connection with FIG. 12B, are shown secured in position, for example, by metallurgically bonding the thermal transfer structures to the cold rails 1320 disposed at the ends thereof in the two arrays (or banks) of electronics cards 1330 illustrated. In the embodiment depicted in FIG. 13, electronics cards 1330 are shown docked and latched in respective sockets 1331 of the electronic system 1300. As illustrated, the thermal transfer structures 1200', and in particular, the thermally conductive spring assemblies 1235 thereof, are sized and positioned to engage the first and second surfaces on opposite sides of the electronics cards with the cards docked in operative position within the respective sockets. In the embodiment depicted, the thermal transfer structures 1200' comprise upward-facing, U-shaped compression springs, and the thermal transfer structures sandwich the electronics cards therebetween in an interleaved or alternating pattern of thermal transfer structures and electronics cards. Note with respect to cooled electronic system 1300 of FIG. 13, that the electronics cards may be individually docked and undocked within the respective sockets, without requiring any disassembly of the cooling apparatus, and in particular, the thermal transfer structures 1200' coupled to the side surfaces thereof via the thermally conductive spring assemblies 1235. In one embodiment, this allows for separate manufacturing of the cooling apparatus, and placement of the apparatus as a single piece into the electronic system. Additionally, once the cooling apparatus is installed on the electronic system, the electronic cards may be separately docked or undocked, as required, for example, for installation, maintenance, or repair.

Figure 14B:
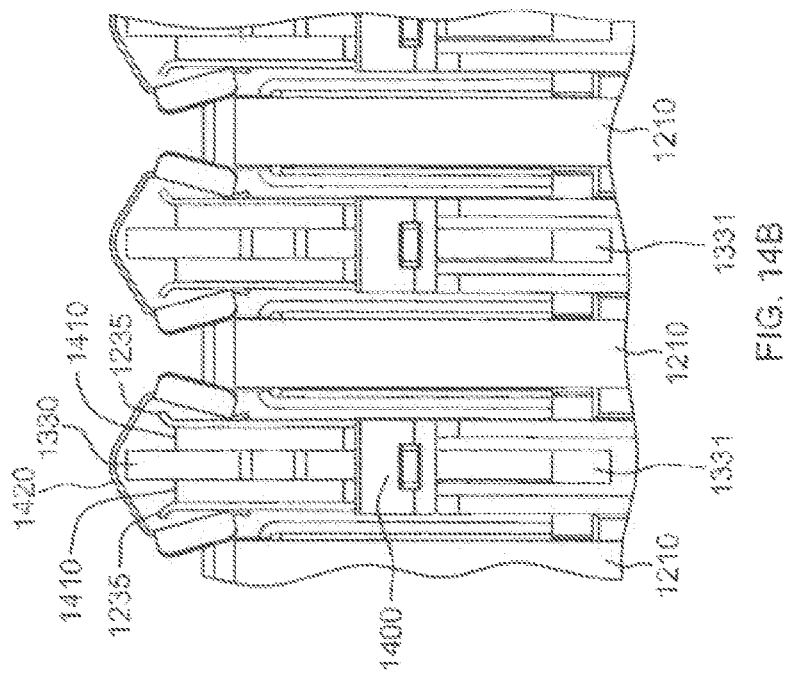
FIG. 14B is an end elevational view of a portion of the cooled electronic system of FIG. 14A, in accordance with one or more aspects of the present invention.
Figure 14A:
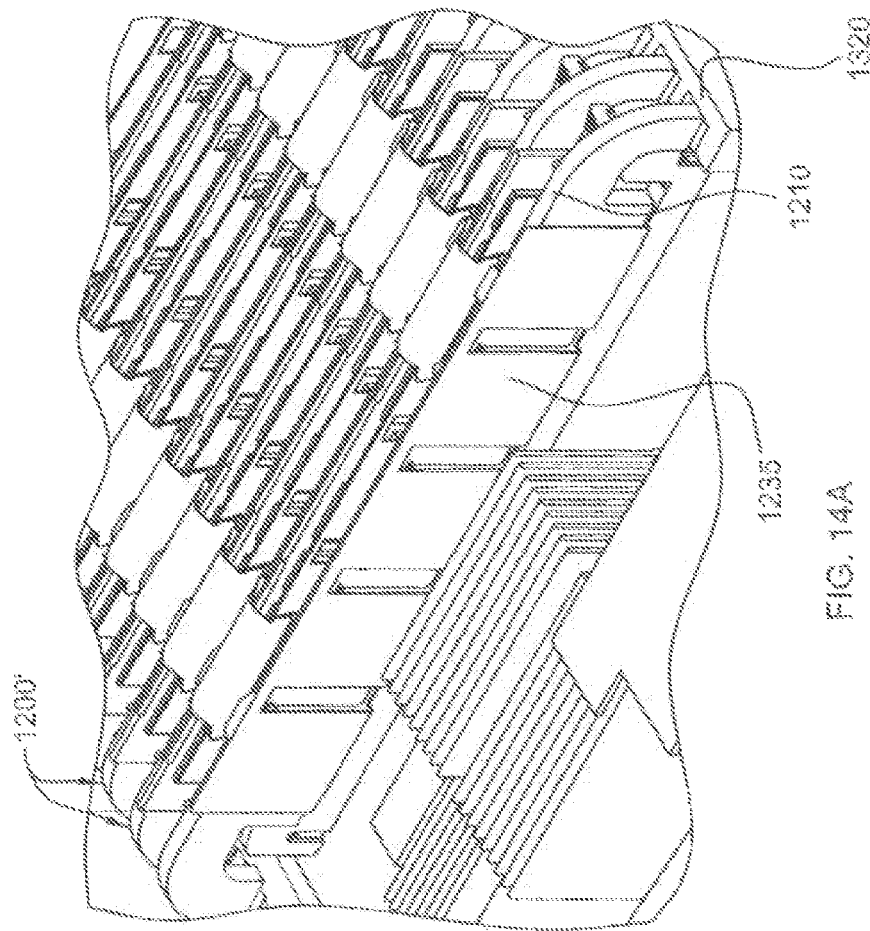
FIG. 14A is a partial depiction of an alternate embodiment of the cooled electronic system of FIG. 13, and illustrating use of a plurality of spring clips to facilitate spring-biased coupling of first and second thermally conductive spring assemblies to first and second sides of an electronics card, in accordance with one or more aspects of the present invention.

FIGS. 14A & 14B depict an enhancement of the cooled electronic system of FIG. 13. Referring to these figures collectively, an interleaved bank of thermal transfer structures 1200' and electronics cards 1330 is illustrated. Thermal transfer structures 1200' include (in this embodiment) upward-facing, U-shaped compression springs 1235 on the first and second thermal conduction surfaces of the thermal spreaders 1210, with the thermal spreaders being, for example, metallurgically joined to a first and second cold rail 1320 disposed at opposite ends of the depicted bank of electronics cards. As illustrated in the end elevational view of FIG. 14B, electronics cards 1330 reside in respective sockets 1331 which include latches 1400 that facilitate the latching or unlatching of the electronics card within the socket. Each electronics card 1330 includes, in this embodiment, one or more chips or modules 1410 disposed on a first side thereof and one or more chips or modules 1410 disposed on a second side thereof. The thermally conductive spring assemblies 1235 are shown in physical engagement with the chips or modules 1410 on the different sides of the electronics cards, and this engagement is enhanced by the use of multiple spring clips 1420 along the top of a respective assembly of two adjacent thermal transfer structures and an electronics card. Spring clips 1420 are configured to apply an additional spring force to at least portions of the first and second thermally conductive spring assemblies 1235 in physical engagement with the opposite sides of the respective electronics card 1330. This additional spring force further facilitates good thermal contact between the electronics card and the adjacent thermal transfer structures 1200'.

By way of specific example, referencing FIGS. 12A-14B, the cooling apparatus disclosed herein may comprise various different types of thermal transfer structures (or assemblies), each with thermally conductive spring assemblies on one or both main sides thereof. For example, the spring assemblies may be metallurgically attached to the respective thermal conduction surfaces of the thermal spreaders, and the thermal spreaders may be metallurgically bonded to coolant-carrying cold rails located on opposite sides of one or more banks of cards. By way of specific example, the electronics cards might comprise DIMM cards.

In the embodiment depicted, the cooling apparatus (or cooling subassembly) includes cold plates, cold rails, connecting tubing, and arrays of thermal transfer structures with thermally conductive springs attached to the thermal spreaders of the transfer structures. These embodiments can (due to the metallurgical bonding) advantageously reduce thermal resistance between the thermal spreaders and the cold rails, for example, as compared with the embodiments of FIGS. 8A-11C. Further, the resultant assembly can advantageously be lowered into the electronic system (e.g., server node) as a monolithic structure, with the cold plates being bolted to their respective receiving structures. In an alternate approach, after the cooling apparatus has been lowered into the electronic system, the thermal transfer structures with their respective springs may be placed in between the card-receiving sockets and metallurgically bonded to the respective cold rails. The electronics cards may then be docked in their respective sockets, with spring forces being exerted on the electronics cards by the adjacent thermally conductive spring assemblies. These spring forces are configured to ensure or enhance thermal contact between the thermal transfer structures and the electronics cards. Multiple springs or sections of springs may be employed within the assemblies to facilitate independence of the springs to accommodate, for example, differently sized chips or modules on the side surfaces of the cards. Further, those skilled in the art will note that the above-described C-shaped, dual compression spring, upward-facing, U-shaped compression spring, and downward-facing, U-shaped compression spring, are presented by way of example only, as is the thermal spreader, which in the embodiments of FIGS. 12A-14B, comprises a thermal spreader plate.

Figure 15A:
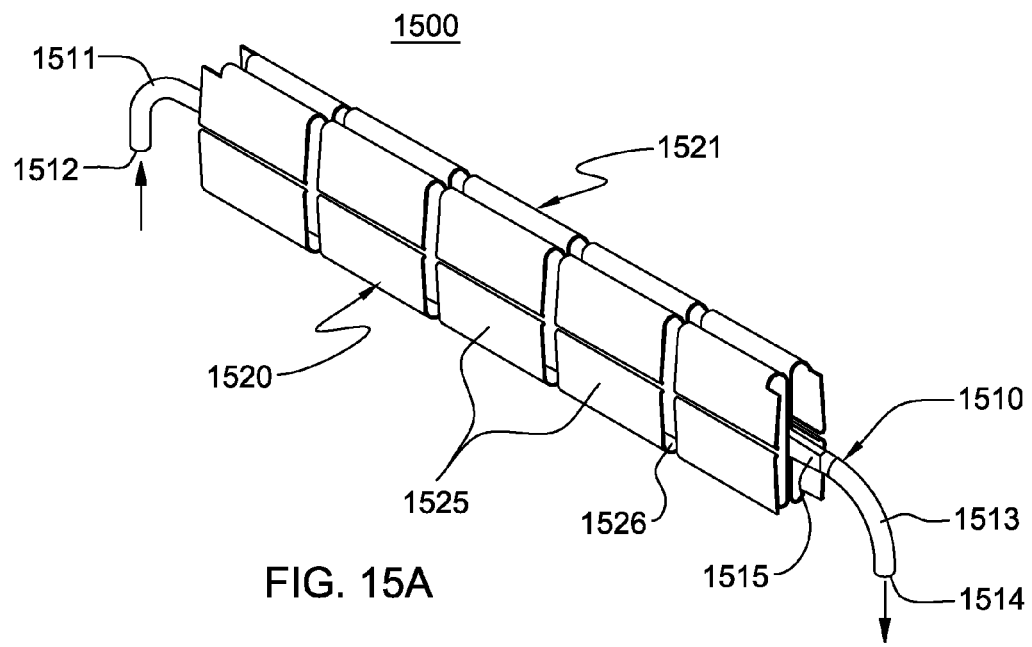
FIG. 15A depicts an alternate embodiment of a thermal transfer structure of a cooling apparatus, in accordance with one or more aspects of the present invention.
Figure 15B:
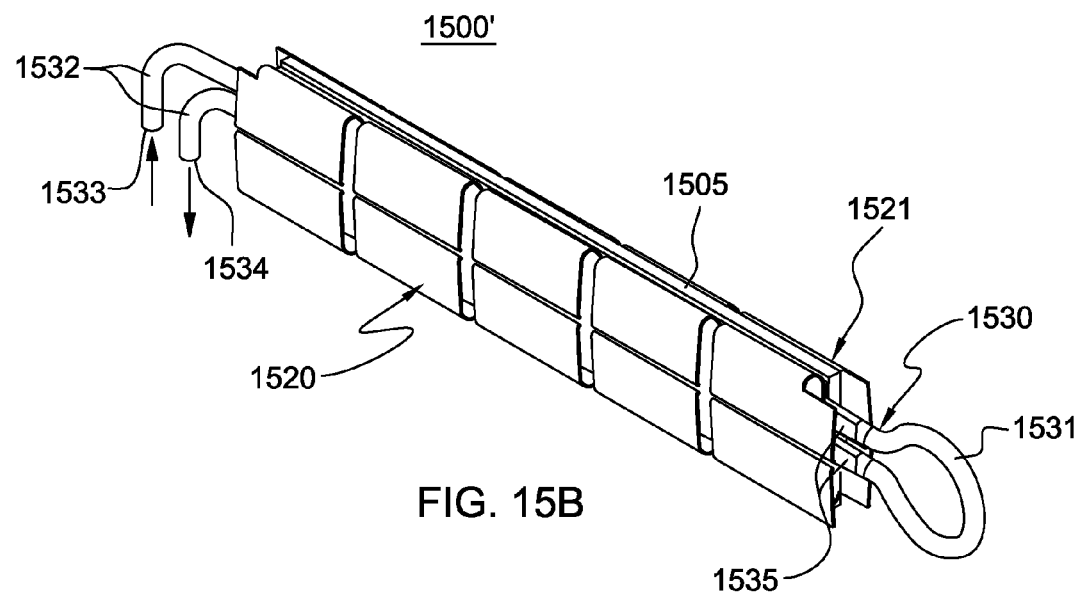
FIG. 15B depicts another embodiment of a thermal transfer structure of a cooling apparatus, in accordance with one or more aspects of the present invention.

FIGS. 15A & 15B depict alternate embodiments of thermal transfer structures, in accordance with one or more aspects of the present invention.

In FIG. 15A, a thermal transfer structure 1500 is depicted, wherein the thermal spreader comprises a thermal spreader tube 1510 which comprises a coolant-carrying tube with a flattened tube section 1515. As illustrated, thermal spreader tube 1510 also includes a first rounded tube section 1511 with a coolant inlet 1512, and a second rounded tube section 1513 with a coolant outlet 1514. The flattened tube section 1515 includes a first side and a second side, and has a first thermally conductive spring assembly 1520 secured to the first side of the flattened tube section 1515, and a second thermally conductive spring section 1521 secured to the second side of the flattened tube section 1515. Each spring assembly 1520, 1521 includes, in this embodiment, multiple C-shaped, dual compression springs 1525 separated by reliefs 1526. In one embodiment, the spring assemblies are fabricated of metal, and the thermal spreader tube 1510 comprises a metal tube, such as a copper tube. Note that, in this embodiment, the thermally conductive spring assemblies 1520, 1521 may be metallurgically bonded to their respective side of the flattened tube section 1515, such as by soldering, brazing or welding. Note also that the thermal transfer structure of FIG. 15A omits a spreader plate, and assumes that the coolant inlet and outlet manifolds for the thermal spreader tube 1510 are disposed at opposite sides of the card array, in a manner similar to that described above with respect to the cold rails of FIGS. 13-14B.

FIG. 15B depicts an alternate embodiment of a thermal transfer structure 1500', wherein the coolant inlet and outlet manifolds are assumed to be disposed on the same side of the structure, and thus, the same side of the card array. This is accommodated, in the embodiment depicted, by providing thermal transfer structure 1500' with a thermal spreader 1505 having thermally conductive spring assemblies 1520, 1521 secured to opposite sides thereof. As illustrated, thermal spreader 1505 comprises a spreader plate with respective recesses or channels in the plate, to accommodate flattened tube sections 1535 of a coolant-carrying tube 1530. Coolant-carrying tube 1530 includes rounded tube sections 1532 at a common end of the thermal transfer structure 1500' that include a coolant inlet 1533 and a coolant outlet 1534. At an opposite end edge of the thermal transfer structure 1500', a loop or bend 1531 is provided, which allows coolant to enter and exit the coolant-carrying tube 1530 at the same end edge of the thermal transfer structure.

Figure 16A:
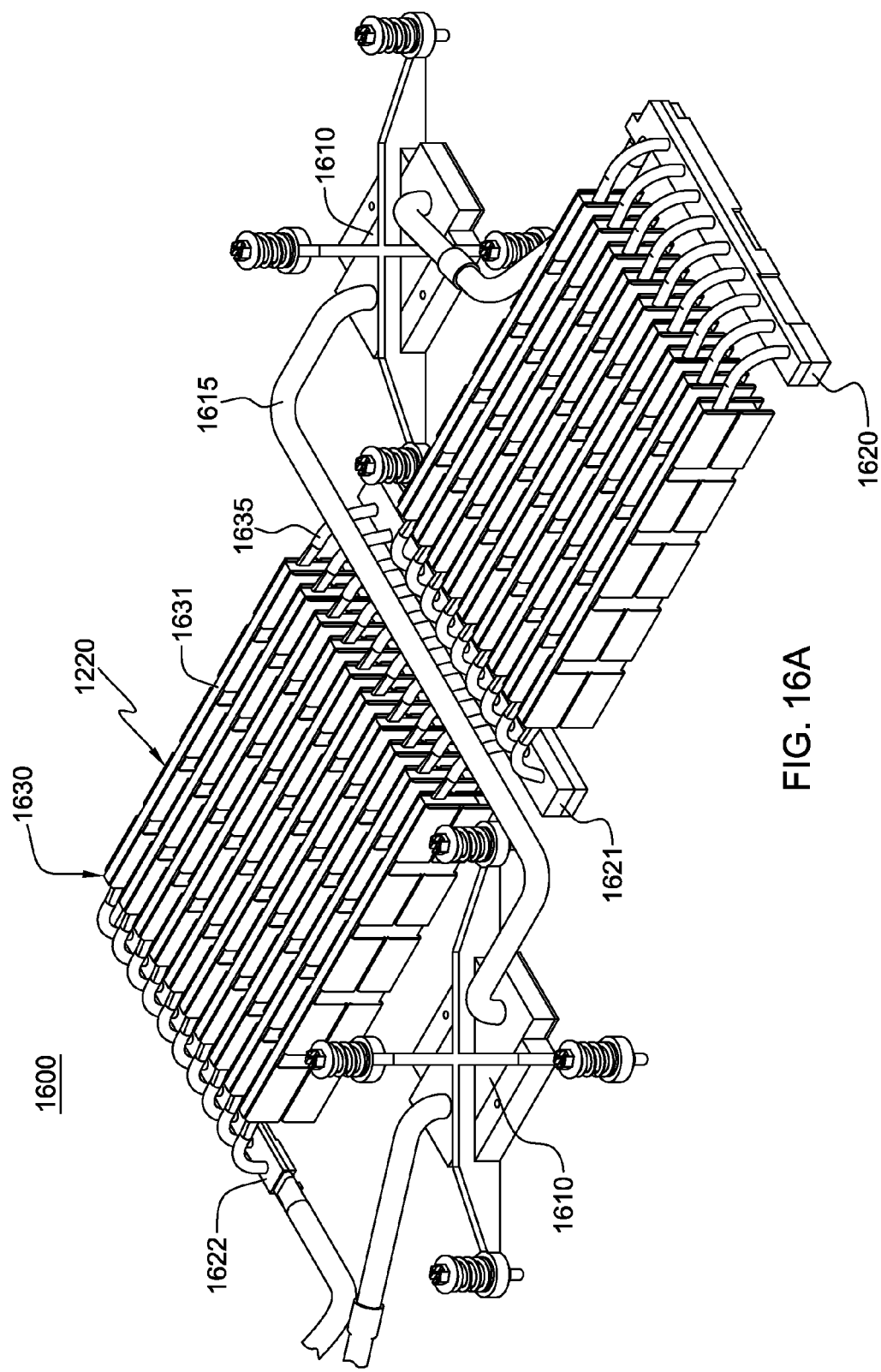
FIG. 16A illustrates another embodiment of a cooling apparatus for a cooled electronic system, in accordance with one or more aspects of the present invention.

FIG. 16A depicts an alternate embodiment of a cooling apparatus 1600 for an electronic system, such as a server node of a coolant-cooled electronics rack, in accordance with one or more aspects of the present invention. In this embodiment, cooling apparatus 1600 includes multiple cold plates 1610, multiple coolant manifolds 1620, 1621 & 1622, and multiple coolant-carrying tubes 1615 coupling the cold plates and coolant manifolds in fluid communication with a coolant inlet and outlet (not shown) of the cooling apparatus. Liquid-cooled cold plates 1610 may be configured to couple to one or more high-heat-generating components, such as one or more processor modules, and the coolant-carrying tubes 1615 may be differently sized to accommodate a desired flow of coolant through, for example, the coolant manifolds 1620, 1621 & 1622 (which comprise one embodiment of a coolant-cooled structure). In FIG. 16A, a plurality of thermal transfer structures 1630 are divided into two arrays to accommodate two banks of electronics cards (not shown). The thermal transfer structures 1630 include, by way of example, thermal spreaders 1631, which have corresponding recesses sized to accommodate a flattened tube portion of a respective coolant-carrying tube 1635, as well as, by way of example, the thermally conductive spring assemblies 1220 described above in connection with FIG. 12A. By way of specific example, coolant manifold 1620 may be configured as a coolant supply manifold supplying coolant-carrying tubes 1635 in a first array of thermal transfer structures 1630. Middle coolant manifold 1621 may comprise a single chamber which allows coolant to flow from the coolant-carrying tubes 1635 of the first array of thermal transfer structures to the coolant-carrying tubes 1635 of the second array of thermal transfer structures. Coolant manifold 1622 may be configured as a return manifold facilitating return of exhausted coolant from the coolant-carrying tubes to, for example, a rack-level exhaust manifold, such as described above.

Advantageously, with the configuration of FIG. 16A, the cooling apparatus may again be separately fabricated as a monolithic assembly and then integrated into a cooling system by, for example, securing the cold plates to the respective plate-receiving structures. One advantage of such an approach is that the rigid coolant-carrying tubes 1635 may be separately metallurgically bonded to the coolant manifolds 1620, 1621, 1622, away from the electronic system, and subsequently installed therein as a single cooling apparatus unit.

Figure 16B:
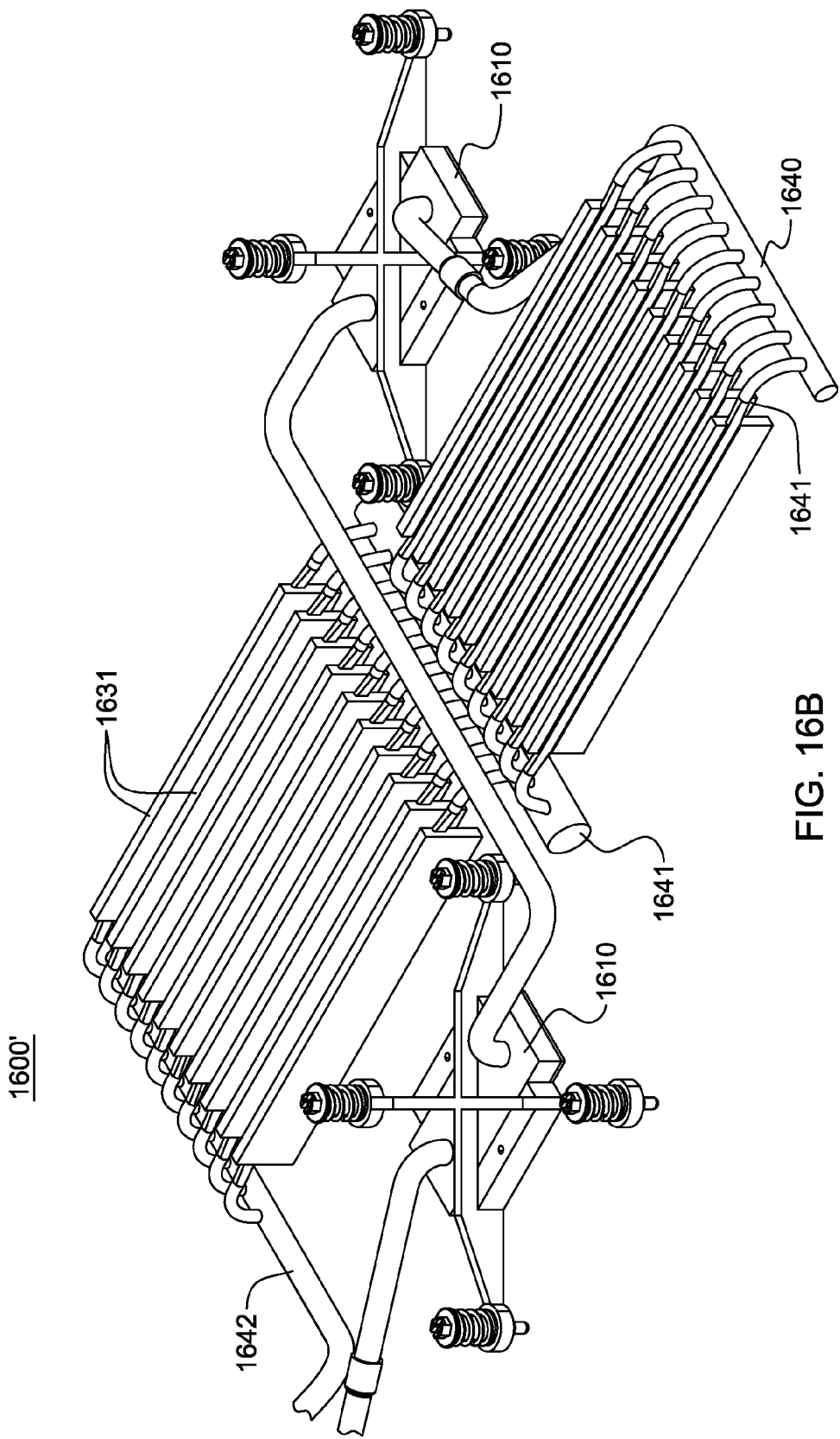
FIG. 16B depicts a further embodiment of a cooling apparatus for a cooled electronic system, in accordance with one or more aspects of the present invention.

FIG. 16B depicts a cooling apparatus 1600' similar to that described above in connection with the cooling apparatus of FIG. 16A. A difference in this implementation is the substitution of coolant manifold tubes 1640, 1641, 1642 for the coolant manifolds 1620, 1621, 1622 of the embodiment of FIG. 16A. Note with respect to the cooling apparatus embodiment of FIG. 16B, that the thermally conductive spring assemblies are not shown in order to illustrate coolant-carrying tubes 1635 residing in respective tube-receiving recesses within the thermal spreaders 1631 of the thermal transfer structures. As illustrated in FIGS. 16A & 16B, the thermal transfer structures are offset or staggered, and are configured, for example, with the desired manufacturing tolerances. Note also that the coolant manifold tube 1641 may comprise an inlet and outlet mixing chamber, wherein coolant flowing from the first array of thermal transfer structures mixes and then flows through the second array of thermal transfer structures.

Figure 17A:
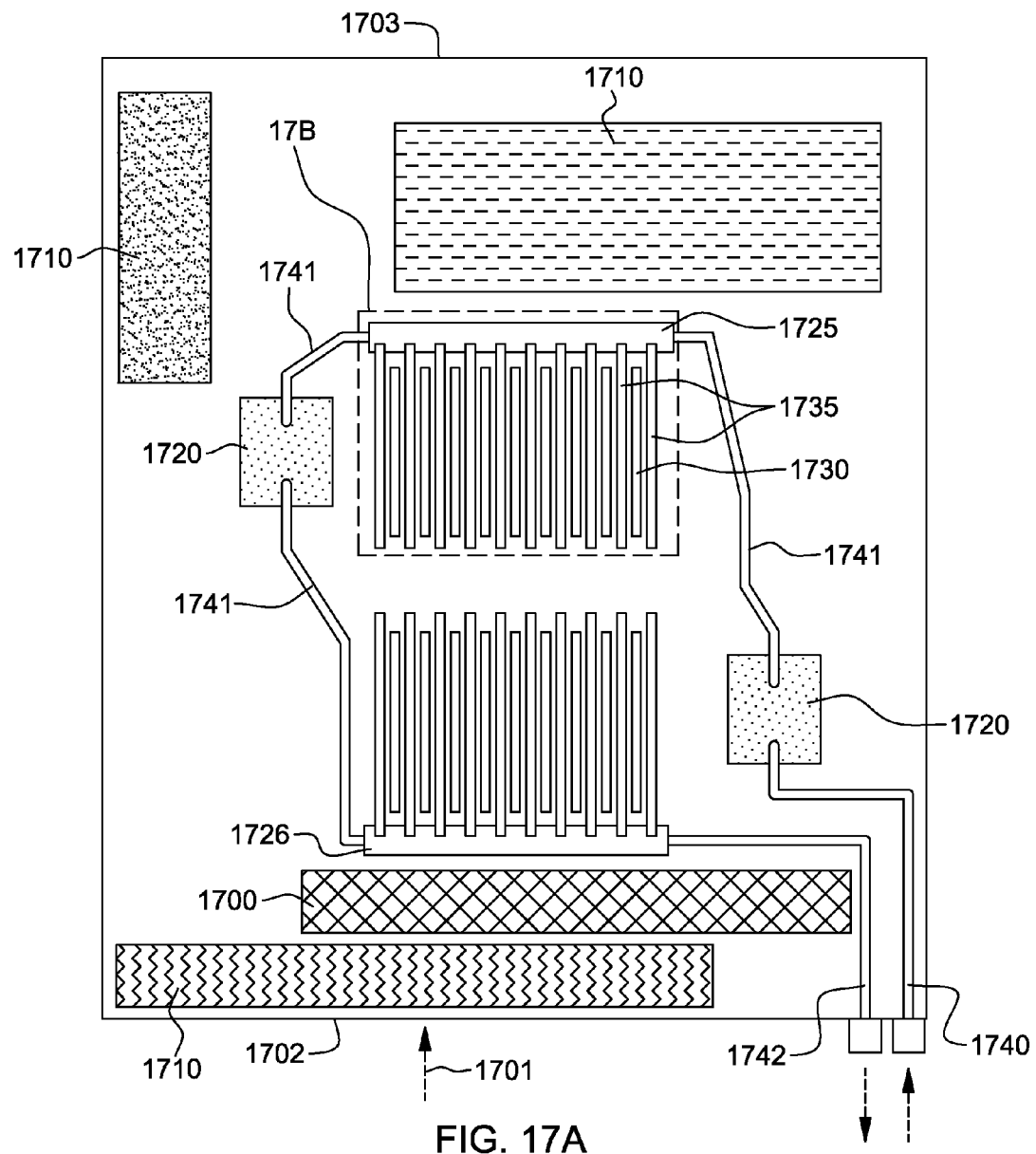
FIG. 17A is a plan view of one embodiment of an electronic system layout of a cooled electronic system for a coolant-cooled electronics rack, and illustrating multiple coolant-cooled cold plates and multiple coolant-cooled cold rails coupled in fluid communication, in accordance with one or more aspects of the present invention.

FIG. 17A illustrates another embodiment of a cooled electronic system component layout, wherein one or more air-moving devices 1700 provide forced airflow 1701 to cool multiple components 1710 within the electronic system. Cool air is taken in through a front 1702 and exhausted out a back 1703 of the electronic system (or node). The multiple components to be cooled include, for example, multiple processor modules to which coolant-cooled cold plates 1720 are coupled, as well as multiple arrays of electronics cards 1730 (e.g., memory modules, such as dual in-line memory modules (DIMMs)), which are to be cooled, at least in part, via thermally coupling to adjacent thermal transfer structures 1735 of the cooling apparatus. Note that, as used herein, "thermally coupling" refers to the existence of a physical thermal transport path between components, for example, between an electronics card and an adjacent thermal transfer structure through which heat may be conducted from one to the other. Size, material, and configuration of the springs are chosen to facilitate this thermal conduction.

The illustrated liquid-based cooling apparatus further includes multiple coolant-carrying tubes connecting in fluid communication coolant-cooled cold plates 1720 and coolant manifolds 1725, 1726. As illustrated in the enlarged depiction of FIG. 17B, the coolant manifold 1725 may comprise, in one embodiment, a coolant supply manifold 1760 and a coolant return manifold 1761. As illustrated, multiple bridge tubes 1741 (FIG. 17A) connect in series a first coolant-cooled cold plate 1720, coolant manifold 1725, a second coolant-cooled cold plate 1720, and then second coolant manifold 1726. Note that this configuration is provided by way of example only, and that the concepts disclosed herein may be readily adapted to use with various configurations of cooled electronic system layouts. Note also that, as depicted herein, the coolant supply and return manifolds are elongate structures with one or more channels therein through which coolant passes.

Figure 17B:
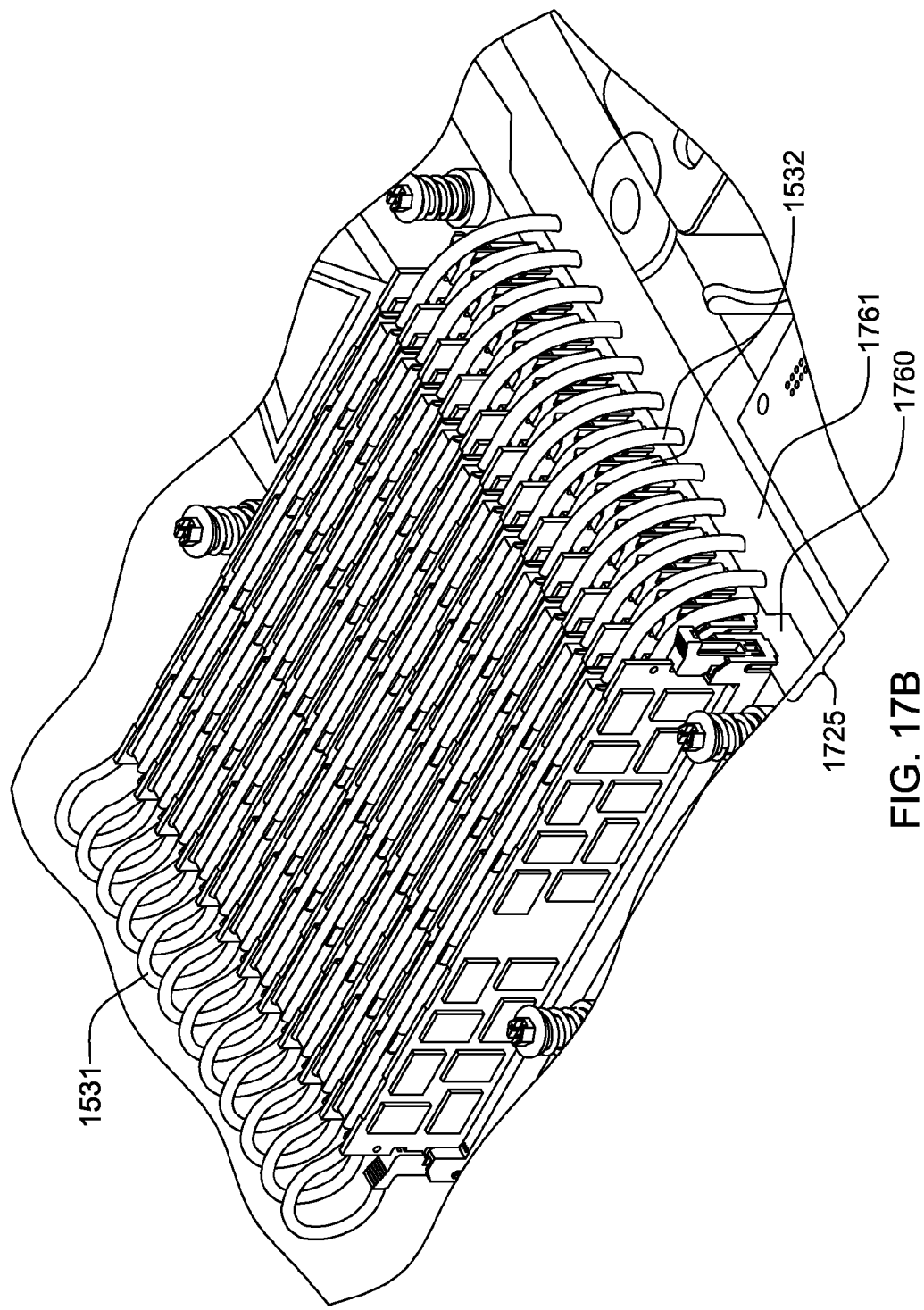
FIG. 17B is a partial depiction of an implementation of the cooled electronic system layout of FIG. 17A, and illustrating a bank of electronics cards with a cooling apparatus coupled thereto comprising multiple thermal transfer structures, in accordance with one or more aspects of the present invention.

In the embodiment of FIGS. 17A & 17B, the thermal transfer structures may comprise a structure such as described above in connection with FIG. 15B, wherein a heat spreader tube passes through the structure with a loop 1531 (see FIG. 17B) at one end, and rounded tube portions 1532, at the other end for coupling in fluid communication the heat spreader tube with the coolant supply and return manifolds 1760, 1761. As illustrated in FIGS. 17A & 17B, the coolant plenums are disposed in the layout of FIGS. 17A & 17B at the ends of the electronics cards 1730, and the thermal transfer structures and electronics cards are interleaved in the different banks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A cooling apparatus comprising:
 a thermal transfer structure mounted to an electronic system and configured and positioned to engage at least one electronics card with docking of the at least one electronics card within at least one socket of the electronic system, wherein the at least one electronics card is docked or undocked from the at least one socket independent of the thermal transfer structure, the thermal transfer structure comprising:
 a thermal spreader comprising a first thermal conduction surface; and
 a thermally conductive spring assembly secured to the thermal spreader and positioned and configured for operative docking or undocking of an electronics card of the at least one electronics card, into or from a socket of the at least one socket of the electronic system, without removal of the thermal transfer structure from the electronics system, and to reside between and physically couple a first side of the electronics card and the first thermal conduction surface of the thermal spreader with docking of the electronics card within the socket, of the at least one socket, of the electronic system, and thereby facilitate conduction of heat from the electronics card to the thermal spreader; and wherein the electronics card comprises multiple electronic components mounted to the first side thereof, and wherein the thermally conductive spring assembly of the thermal transfer structure comprises a plurality of compression springs, the plurality of compression springs being spaced along the first thermal conduction surface of the thermal spreader, and one or more compression springs of the plurality of compression springs each being sized and configured to independently, physically engage with a spring force, two or more respective electronic components of the multiple electronic components mounted to the first side of the electronics card with docking of the electronics card in the socket of the electronic system.

2. The cooling apparatus of claim 1, wherein the plurality of compression springs of the thermally conductive spring assembly comprise a plurality of C-shaped, dual compression springs coupled to the first thermal conduction surface of the thermal spreader, the plurality of C-shaped, dual compression springs each being sized and configured to physically engage with the spring force one or more respective electronic components of the electronics card with docking of the electronics card in the socket of the electronic system.

3. The cooling apparatus of claim 1, wherein the plurality of compression springs of the thermally conductive spring assembly comprise a plurality of U-shaped compression springs coupled to the first thermal conduction surface of the thermal spreader, the plurality of U-shaped compression springs each being sized and configured to physically engage with the spring force one or more respective electronic components of the electronics card with docking of the electronics card in the socket of the electronic system.

4. The cooling apparatus of claim 1, wherein the thermal spreader comprises a thermal transfer plate, the thermal transfer plate comprising a thermally conductive extension extending from an end edge thereof, the thermally conductive extension of the thermal transfer plate being metallurgically bonded to a coolant-cooled structure, the coolant-cooled structure comprising a thermally conductive structure with at least one coolant-carrying channel extending therein.

5. The cooling apparatus of claim 1, wherein the thermal spreader comprises a coolant-carrying tube, the coolant-carrying tube comprising a tube section running parallel to the electronics card with the electronics card docked within the socket of the electronic system.

6. The cooling apparatus of claim 5, wherein the tube section is a flattened tube section and comprises a first side and a second side, the first side of the flattened tube section at least partially defining the first thermal conduction surface of the thermal spreader, and the second side of the flattened tube section at least partially defining a second thermal conduction surface of the thermal spreader, and wherein the thermally conductive spring assembly, comprising the plurality of compression springs, is metallurgically bonded to the first side of the flattened tube section.

7. The cooling apparatus of claim 1, wherein the thermal transfer structure is configured to engage multiple electronics cards with docking of the multiple electronics cards within multiple sockets of the electronic system, and wherein the thermal spreader further comprises a second thermal conduction surface, the first thermal conduction surface and the second thermal conduction surface being opposite sides of the thermal spreader, and wherein the electronics card is a first electronics card of the multiple electronics cards, the socket is a first socket of the multiple sockets, and the thermally conductive spring assembly is a first thermally conductive spring assembly, and wherein the thermal transfer structure further comprises a second thermally conductive spring assembly secured to the second thermal conduction surface of the thermal spreader and configured to reside between and physically couple a second side of a second electronics card of the multiple electronics cards and the second thermal conduction surface of the thermal spreader with docking of the second electronics card within a second socket of the multiple sockets of the electronic system, and thereby facilitate conduction of heat from the second electronics card to the second thermal conduction surface of the thermal spreader, wherein the first socket and the second socket are adjacent sockets of the electronic system.

8. The cooling apparatus of claim 1, wherein the thermal transfer structure is a first thermal transfer structure, and wherein the cooling apparatus further comprises a second thermal transfer structure, the second thermal transfer structure being configured to engage a second side of the electronics card with docking of the electronics card in the socket of the electronic system, the second thermal transfer structure including a second thermal spreader, comprising a second thermal conduction surface, and a second thermally conductive spring assembly coupled to the second thermal spreader and positioned and configured to reside between and physically couple the second side of the electronics card and the second thermal conduction surface of the second thermal spreader with docking of the electronics card within the socket.

9. The cooling apparatus of claim 8, further comprising at least one spring clip, the at least one spring clip being configured and sized to couple together the first thermally conductive spring assembly and the second thermally conductive spring assembly, and apply a compressive force thereto to ensure physical engagement of the first thermally conductive spring assembly to the first side of the first electronics card and physical engagement of the second thermally conductive spring assembly to the side of the first electronics card, and thereby facilitate conduction of heat from the first electronics card to the first and second thermal transfer structures.

10. The cooling apparatus of claim 8, wherein the first thermal spreader and the second thermal spreader are metallurgically bonded to at least one coolant-cooled structure, the at least one coolant-cooled structure comprising at least one thermally conductive structure with at least one coolant-carrying channel extending therein, and wherein the first thermal transfer structure and the second thermal transfer structure facilitate transfer of heat from the first electronics card to coolant flowing through the at least one coolant-cooled structure, and wherein the first thermal transfer structure and the second thermal transfer structure remain fixed in position adjacent to the socket of the electronic system with docking therein or undocking therefrom of the electronics card.

11. A cooled electronic system comprising:
an electronic assembly, the electronic assembly comprising:
an electronics card comprising a first side and a second side, the first side and the second side being opposite sides of the electronics card;
a socket for receiving the electronics card; and
a cooling apparatus comprising a thermal transfer structure mounted to the electronic assembly and configured and positioned to engage the electronics card with docking of the electronics card within the socket, wherein the electronics card is docked or undocked from the socket, independent of the thermal transfer structure, the thermal transfer structure comprising:
- a thermal spreader comprising a first thermal conduction surface;
- a thermally conductive spring assembly secured to the thermal spreader and positioned and configured for operative docking or undocking of the electronics card into or from the socket of the electronic assembly, without removal of the thermal transfer structure from the electronic assembly, and to reside between and physically couple the first side of the electronics card to the first thermal conduction surface of the thermal spreader with docking of the electronics card within the socket, and thereby facilitate conduction of heat from the electronics card to the thermal spreader; and
- wherein the electronics card comprises multiple electronic components mounted to the first side thereof, and wherein the thermally conductive spring assembly of the thermal transfer structure comprises a plurality of compression springs, the plurality of compression springs being spaced along the first thermal conduction surface of the thermal spreader, and one or more compression springs of the plurality of compression springs each being sized and configured to independently, physically engage with a spring force, two or more respective electronic components of the multiple electronic components mounted to the first side of the electronics card with the docking of the electronics card in the socket.

12. The cooled electronic system of claim 11, wherein the cooling apparatus further comprises a liquid-cooled structure disposed at one end of the socket, the liquid-cooled structure comprising a thermally conductive structure with at least one coolant-carrying channel extending therein, and wherein the thermal transfer structure is metallurgically bonded to the liquid-cooled structure to facilitate conduction of heat from the thermal spreader into the liquid-cooled structure.

13. The cooled electronic system of claim 11, wherein the plurality of compression springs of the thermally conductive spring assembly comprise a plurality of C-shaped, dual compression springs coupled to the first thermal conduction surface of the thermal spreader, the plurality of C-shaped, dual compression springs each being sized and configured to physically engage with the spring force, the first side of the electronics card with docking of the electronics card in the socket of the electronic assembly.

14. The cooled electronic system of claim 11, wherein the plurality of compression springs of the thermally conductive spring assembly comprise a plurality of U-shaped compression springs coupled to the first thermal conduction surface of the thermal spreader, the plurality of U-shaped compression springs each being sized and configured to physically engage with the spring force, the first side of the electronics card with docking of the electronics card in the socket of the electronic assembly.

15. The cooled electronic system of claim 11, wherein the thermal spreader comprises a coolant-carrying tube, the coolant-carrying tube comprising a tube section running parallel to the electronics card with the electronics card docked within the socket of the electronic system.

16. The cooled electronic system of claim 11, wherein the thermal transfer structure is a first thermal transfer structure, and wherein the cooling apparatus further comprises a second thermal transfer structure, the second thermal transfer structure being configured to engage the second side of the electronics card with docking of the electronics card in the socket of the electronic assembly, the second thermal transfer structure including a second thermal spreader, comprising a second thermal conduction surface, and a second thermally conductive spring assembly coupled to the second thermal spreader and configured to reside between and physically couple the second side of the electronics card and the second thermal conduction surface of the second thermal spreader with docking of the electronics card within the socket.

17. A method of fabricating a cooled electronic system, the method comprising:
- providing an electronic assembly, the electronic assembly comprising:
  - an electronics card comprising a first side and a second side, the first side and the second side being opposite sides of the electronics card; and
  - a socket accommodating docking or undocking of the electronics card therein;
- providing a coolant-cooled structure at one end of the socket, the coolant-cooled structure comprising a thermally conductive structure with at least one coolant-carrying channel extending therein; and
- providing a first thermal transfer structure and a second thermal transfer structure mounted to the electronic assembly and configured to engage the first side and the second side of the electronics card, respectively, with docking of the electronics card within the socket, the electronics card being docked or undocked from the socket, independent of the first thermal transfer structure and second thermal transfer structure, and the first thermal transfer structure and the second thermal transfer structure being secured to the coolant-cooled structure and facilitating transfer of heat from the electronics card to the coolant-cooled structure, the first thermal transfer structure comprising a first thermally conductive spring assembly coupled to a first thermal conduction surface of a first thermal spreader thereof, and the second thermal transfer structure comprising a second thermally conductive spring assembly coupled to a second thermal conduction surface of a second thermal spreader thereof, wherein the first and second thermally conductive spring assemblies are positioned and configured for operative docking or undocking of the electronics card into or from the socket, without removal of the first thermal transfer structure or second thermal transfer structure, and to reside between and physically engage the first side and the second side, respectively, of the electronics card with docking of the electronics card within the socket, and thereby facilitate conduction of heat from the electronics card through the first thermal transfer structure and the second thermal transfer structure to coolant within the coolant-cooled structure; and
- wherein the electronics card comprises multiple electronic components mounted to the first side thereof, and multiple electronic components mounted to the second side thereof, and wherein the first thermal transfer structure comprises a first plurality of compression springs secured to the first thermal conduction surface of the first thermal spreader, and the second thermal transfer structure comprises a second plurality of compression springs secured to the second thermal conduction surface of the second thermal spreader, the first plurality of compression springs being spaced along the first thermal conduction surface of the first thermal spreader, and the second plurality of compression springs being spaced along the second thermal conduction surface of the second thermal spreader, and one or more compression springs of each one of the first and second pluralities of compression springs each being sized and configured to independently, physically engage with a spring force, two or more respective electronic components of the multiple electronic components mounted to each of the first and second sides of the electronics card with docking of the electronics card in the socket.

\* \* \* \* \*